(12) United States Patent
Marakhtanov et al.

(10) Patent No.: US 12,165,844 B2
(45) Date of Patent: Dec. 10, 2024

(54) UNIFORMITY CONTROL CIRCUIT FOR IMPEDANCE MATCH

(71) Applicant: Lam Research Corporation, Fremont, CA (US)

(72) Inventors: Alexei M. Marakhtanov, Albany, CA (US); Felix Leib Kozakevich, Sunnyvale, CA (US); Bing Ji, Pleasanton, CA (US); John P. Holland, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 176 days.

(21) Appl. No.: 18/010,194

(22) PCT Filed: Nov. 2, 2021

(86) PCT No.: PCT/US2021/057787
§ 371 (c)(1),
(2) Date: Dec. 13, 2022

(87) PCT Pub. No.: WO2022/108754
PCT Pub. Date: May 27, 2022

(65) Prior Publication Data
US 2023/0253184 A1    Aug. 10, 2023

Related U.S. Application Data

(60) Provisional application No. 63/115,469, filed on Nov. 18, 2020.

(51) Int. Cl.
*H01J 37/00* (2006.01)
*H01J 37/32* (2006.01)
(Continued)

(52) U.S. Cl.
CPC .. *H01J 37/32183* (2013.01); *H01J 37/32091* (2013.01); *H03H 7/38* (2013.01); *H01J 2237/3343* (2013.01); *H03H 7/40* (2013.01)

(58) Field of Classification Search
CPC ........... H01J 37/32183; H01J 37/32091; H01J 37/32; H01L 21/3065; H01L 21/683; H05H 1/46
See application file for complete search history.

(56) References Cited

U.S. PATENT DOCUMENTS 7,611,603 B2    11/2009    Yamazawa
9,652,567 B2 *   5/2017    Valcore, Jr. ........... G06F 30/367
(Continued)

FOREIGN PATENT DOCUMENTS

KR    2017-0121500 A    11/2017

OTHER PUBLICATIONS

ISR & WO PCT/US2021/057787, dated Feb. 28, 2022, 11 pages.

*Primary Examiner* — Tuan T Lam
(74) *Attorney, Agent, or Firm* — PENILLA IP, APC

(57) ABSTRACT

An impedance match housing is described. The impedance match housing includes an impedance matching circuit having an input that is coupled to a radio frequency (RF) generator. The impedance matching circuit has an output that is coupled to a first RF strap. The impedance match housing includes a uniformity control circuit coupled in parallel to a portion of the first RF strap to modify uniformity in a processing rate of a substrate when the substrate is processed within a plasma chamber.

20 Claims, 14 Drawing Sheets

(51) Int. Cl.
*H03H 7/38* (2006.01)
*H03H 7/40* (2006.01)

(56) References Cited

U.S. PATENT DOCUMENTS

| | | | |
|---|---|---|---|
| 11,348,761 B2* | 5/2022 | Carroll | H01J 37/32183 |
| 2015/0091441 A1 | 4/2015 | Marakhtanov et al. | |
| 2017/0103870 A1 | 4/2017 | Marakhtanov et al. | |
| 2019/0318919 A1* | 10/2019 | Lyndaker | H01J 37/32935 |
| 2020/0144032 A1* | 5/2020 | Ulrich | H01L 21/67069 |
| 2020/0343123 A1 | 10/2020 | Ye et al. | |
| 2023/0009651 A1* | 1/2023 | Kapoor | H03H 7/38 |

* cited by examiner (Process In situ)

(Ex situ)

(Match with UCC)

UNIFORMITY CONTROL CIRCUIT FOR IMPEDANCE MATCH

CLAIM OF PRIORITY

This application is a national stage filing of and claims priority, under 35 U.S.C. § 371, to PCT/US21/57787, filed on Nov. 2, 2021, and titled "UNIFORMITY CONTROL CIRCUIT FOR IMPEDANCE MATCH", which claims the benefit of and priority, under 35 U.S.C. § 119 (e), to U.S. Provisional Patent Application No. 63/115,469, filed on Nov. 18, 2020, and titled "UNIFORMITY CONTROL CIRCUIT FOR IMPEDANCE MATCH", all of which are incorporated by reference herein in their entirety.

FIELD

The present embodiments relate to systems and methods for using a uniformity control circuit at an output of an impedance match.

BACKGROUND

A plasma tool is used to process many wafers. Each wafer is placed in a plasma chamber. A radio frequency (RF) signal is supplied to the plasma chamber and plasma is generated within the plasma chamber. The plasma is used to process the wafers.

During processing the wafers, some features are etched more than other features. For example, one feature is etched at a higher rate compared to another feature. Without precise etching across an upper surface of each wafer, fabrication of additional layers becomes substantially more difficult due to increased variations in surface topography of the upper surface of each wafer.

It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for using a uniformity control circuit at an output of an impedance match. It should be appreciated that the present embodiments can be implemented in numerous ways, e.g., a process, an apparatus, a system, a device, or a method on a computer readable medium. Several embodiments are described below.

In one embodiment, an impedance match housing is described. The impedance match housing includes an impedance matching circuit having an input that is coupled to a radio frequency (RF) generator. The impedance matching circuit has an output that is coupled to a first RF strap. The impedance match housing includes a uniformity control circuit coupled in parallel to a portion of the first RF strap to modify uniformity in a processing rate of a substrate when the substrate is processed within a plasma chamber.

In an embodiment, a uniformity control circuit is described. The uniformity control circuit includes a first RF strap, a second RF strap coupled to the first RF strap, and a capacitor coupled to the second RF strap. The uniformity control circuit also includes a third RF strap coupled to the capacitor and to the first RF strap. The first RF strap is coupled between an output of an impedance matching circuit and an RF transmission line that is coupled to a plasma chamber.

Some advantages of the herein described systems and methods for using a uniformity control circuit at an output of an impedance match include achieving uniformity across a top surface of a substrate. A uniformity control circuit is coupled to an output of an impedance matching circuit. A capacitance of the uniformity control circuit is modified to achieve the uniformity. For example, the uniformity control circuit includes a variable capacitor and a capacitance of the variable capacitor is changed. As another example, the uniformity control circuit includes a fixed capacitor and the fixed capacitor is replaced with another fixed capacitor to achieve the uniformity. By achieving the uniformity, a uniform topography is created across a top surface of the substrate. As a result, additional layers fabricated on the top surface can also be uniform.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for using a uniformity control circuit at an output of an impedance match. It will be apparent that the present embodiments may be practiced without some or all of these specific details. In other instances, well known operations have not been described in detail in order not to unnecessarily obscure the present embodiments.

Figure 1A:
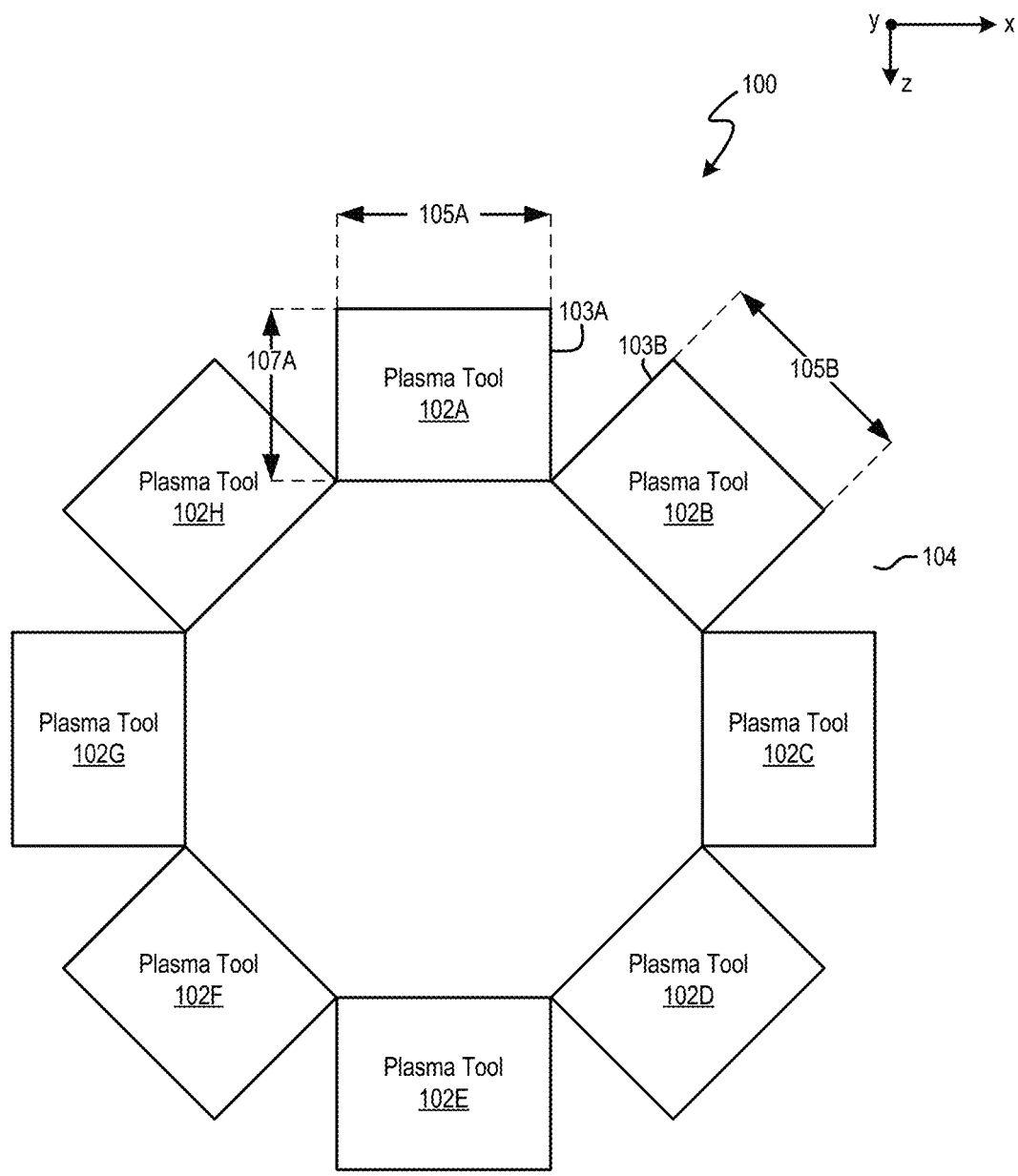
FIG. 1A is a diagram of an embodiment of a top view of a system to illustrate multiple plasma tools that consume a higher amount of floor space than that consumed by other plasma tools described herein with reference to FIG. 1B.
Figure 1B:
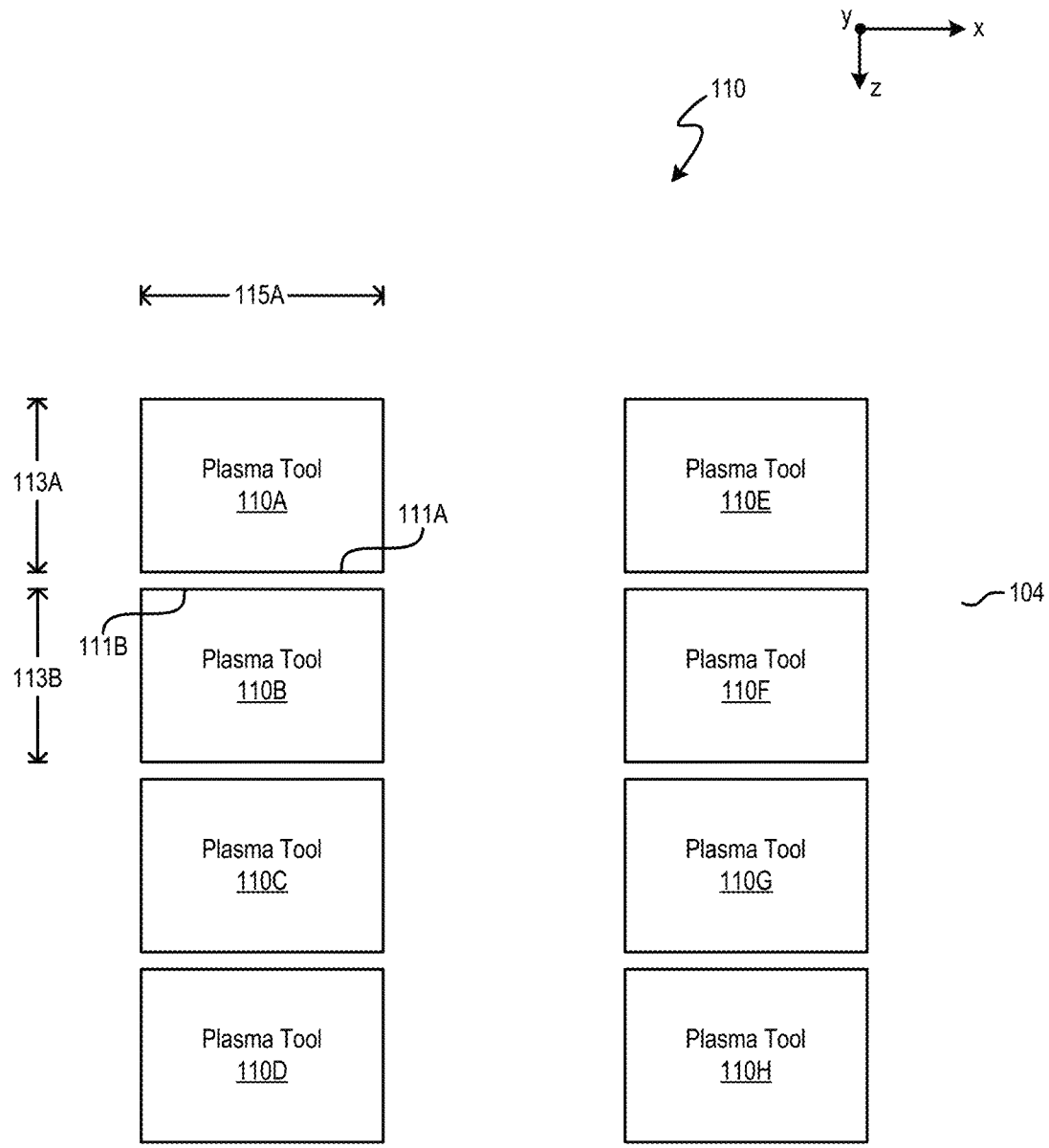
FIG. 1B is a diagram of an embodiment of a system to illustrate multiple plasma tools that consume a lower amount of floor space than that consumed by the plasma tools of FIG. 1A.

FIG. 1A is a diagram of an embodiment of a top view of a system 100 to illustrate multiple plasma tools that consume a higher amount of floor space than that consumed by other plasma tools described herein with reference to FIG. 1B. The system 100 includes multiple plasma tools 102A, 102B, 102C, 102D, 102E, 102F, 102G, and 102H.

Each plasma tool, described herein, has a length, a width, and a depth. For example, the plasma tool 102A has a width 105A and the plasma tool 102B has a width 105B. The width 105A is measured along an x-axis. The plasma tool 102A has a depth 107A, which is measured along a z-axis. The plasma tools 102A-102H are situated on a floor 104 of a fabrication facility to form an octagonal arrangement that occupies more space on the floor 104 than the plasma tools described below with reference to FIG. 1B. Each plasma tool 102A through 102H has the same dimensions, e.g., width, depth, and height, as any other of the plasma tools 102A through 102H.

It should be noted that there is space between any two adjacent plasma tools 102A-102H. For example, a side 103A of the plasma tool 102A is not adjacent to a side 103B of the plasma tool 102B and there is an empty space between the two sides 103A and 103B, and an acute angle is formed between the sides 103A and 103B. The empty space is enough for a human to enter into the space to open the plasma tool 102A or the plasma tool 102B.

In an embodiment, the terms floor space and footprint are used herein interchangeably.

FIG. 1B is a diagram of an embodiment of a system 110 to illustrate multiple plasma tools that consume a lower amount of floor space than that consumed by the plasma tools 102A-102H (FIG. 1A). The system 110 includes multiple plasma tools 110A, 110B, 110C, 110D, 110E, 110F, 110G, and 110H. Each plasma tool 110A through 110H has the same dimensions, e.g., width, depth, and height.

The plasma tool 110A has a width 113A and the plasma tool 110B has a width 113B. The width 113A is measured along the z-axis. Also, the plasma tool 110A has a depth 115A. The depth 115A is less than the depth 107A of the plasma tool 102A (FIG. 1A). The depth 115A is measured along the x-axis.

The plasma tools 110A-110H are situated on the floor 104 to form a rectangular arrangement, and the rectangular arrangement takes less space than that taken by the octagonal arrangement illustrated above with reference to FIG. 1A. For example, a human cannot enter into a space between any two adjacent ones of the plasma tools 110A-110H. As another example, a side 111A of the plasma tool 110A is adjacent to a side 111B of the plasma tool 110B such that there is a negligible amount of space or no space between the sides 111A and 111B. As yet another example, the depth 115A is less than the depth 107A and the width 113A is less than the width 105A.

In an embodiment, instead of eight plasma tools, any other number of tools, such as four or five or six, can be arranged on the floor 104.

In an embodiment, a depth of the plasma tool 110A is greater than a depth of the plasma tool 102A. In one embodiment, a width of the plasma tool 110A is greater than a width of the plasma tool 102A.

Figure 2:
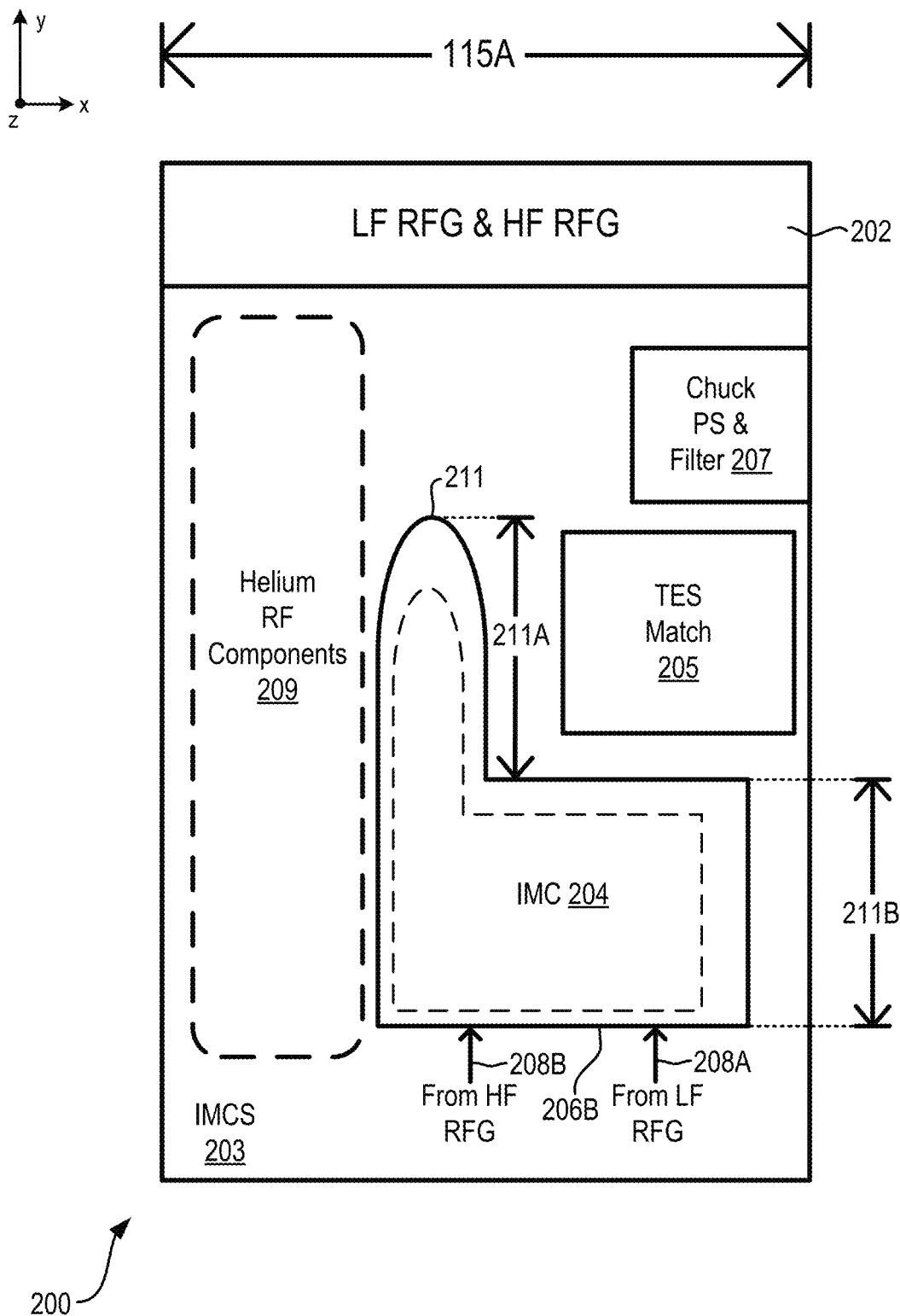
FIG. 2 is a diagram of an embodiment of a system to illustrate a stackable arrangement of components of a plasma tool, such as any of the plasma tools of FIG. 1B.

FIG. 2 is a diagram of an embodiment of a system 200 to illustrate a stackable arrangement of components of a plasma tool, such as any of the plasma tools 110A-110H of FIG. 1B. The system 200 includes a system 202 and an impedance matching circuit system (IMCS) 203. The system 200 is an example of any of the plasma tools 110A through 110H (FIG. 1B).

The IMCS 203 is a housing structure that includes a housing 211. Examples of a housing or a housing structure, as used herein, include a compartment, an enclosure, a box, a container, etc. To illustrate, the housing 211 is made from a metal, such as aluminum, an alloy of aluminum, steel, an alloy of steel, or an alloy of aluminum and steel. The housing 211 encloses an impedance matching circuit (IMC) 204. The IMCS 203 further includes a tunable edge sheath (TES) match enclosure 205, a chuck power supply (PS) and filter enclosure 207, and a set 209 of gas delivery components for an electrostatic chuck. Examples of an enclosure, as used herein, include a compartment, a housing, a box, a container, etc. The chuck PS and filter enclosure 207 includes a chuck power supply that provides direct current (DC) power to a chuck. The chuck PS and filter enclosure 207 further includes a filter that filters out radio frequency (RF) power from being coupled to the DC power to reduce chances of interference of the RF power with the DC power. The TES match enclosure 205 includes a TES match that is coupled to a tunable edge ring that surrounds the chuck. The TES match includes electrical components, such as one or more inductors, one or more resistors, or one or more capacitors, or a combination thereof, and electrical components are coupled to each other. The electrical components of the TES match have impedances that provide a match between an impedance of a load, such as the tunable edge ring, that is coupled to an output of the TES match and a source that is coupled to an input of the TES match. An example of the source coupled to the input of the TES match includes an RF generator and an RF cable that couples the RF generator to the input of the TES match.

The housing 211 has a top portion 211A and a bottom portion 211B. A shape of the top portion 211A is elongated. For example, the shape of the top portion 211A is substantially narrower than a shape of the bottom portion 211B to facilitate the TES match enclosure 205 to be fitted within the IMCS 203. Moreover, the elongated shape of the top portion 211A allows the chuck PS and filter enclosure 207 and the TES match enclosure 205 to be fitted within the IMCS 203. The TES match enclosure 205 is located above the bottom portion 211B and the chuck PS and filter enclosure 207 is located above the TES match enclosure 205. The set 209 is located beside the housing 211 of the IMC 204 on a side that is opposite to a side on which the TES match enclosure 205 is located.

The set 209 includes multiple conduits, such as helium channels, for passage of a coolant gas for controlling a temperature of the chuck of a plasma chamber. The multiple conduits extend to the chuck to cool different zones within a gap between an upper electrode and the chuck of the plasma chamber. The temperature is controlled by increasing or decreasing a flow of the coolant gas to the chuck. For example, the temperature is increased when the flow of the coolant gas to the chuck is increased and the temperature is decreased when the flow of the cooling gas to the chuck is decreased. An example of the coolant gas includes helium and examples of the chuck include an electrostatic chuck (ESC).

Moreover, an area adjacent to the set 209 includes a gap driver, which includes a motor and a set of electronics boards, to control, such as increase or decrease, an amount of the gap between the chuck and the upper electrode of the plasma chamber. The area adjacent to the set 209 is within the IMCS 203 to form a portion of the IMCS 203. The set 209 further includes sensors, such as complex current and voltage sensors, voltage sensors, power sensors, etc., to sense a variable at an output of the IMC 204 or at an input of the IMC 204. Examples of the variable include complex voltage and current, impedance, voltage, power, voltage, current, reflected power, and supplied power.

In one embodiment, a dielectric ring is located between the chuck and the tunable edge ring.

The system 202 includes a low frequency (LF) RF generator and a high frequency RF generator, and is located above the IMCS 203. An example of the low frequency RF generator is an RF generator having a low frequency of operation of 400 kilohertz (kHz) RF generator and an example of the high frequency RF generator is an RF generator having a high frequency of operation of 13.56 megahertz (MHz), 27 MHz, or 60 MHz RF generator. Another example of the low frequency RF generator is an RF generator having the low frequency of operation of 2 MHz. Yet another example of the low frequency RF generator is an RF generator having the low frequency of operation of 100 kHz. The system 202 is situated on top of the IMCS 203 to save space on the floor 104 (FIGS. 1A and 1B).

The housing 211 of the IMC 204 has a bottom wall 206B. The low frequency RF generator of the system 202 is connected via an opening in the bottom wall 206B to circuit components of the impedance matching circuit 204. For example, the low frequency RF generator is coupled via an RF cable 208A that goes through the opening in the bottom wall 206B to couple to the circuit components of the impedance matching circuit 204. Similarly, the high frequency RF generator of the system 202 is connected via an opening in the bottom wall 206B to the circuit components of the impedance matching circuit 204. For example, the low frequency RF generator is coupled via an RF cable 208B that goes through the opening in the bottom wall 206B to couple to the circuit components of the impedance matching circuit 204.

In one embodiment, the terms impedance matching circuit, impedance matching network, match, impedance match, matching network, match circuit, and match network are used herein interchangeably.

In one embodiment, the system 202 is not on top of the IMCS 203 but is situated over the IMCS 203. For example, a carrier, such as a network of support rods, is provided over the IMCS 203, and the system 202 is supported by the carrier.

In an embodiment, the system 202 is located within the IMCS 203.

In one embodiment, the terms substrate support, chuck, and powered electrode as used herein interchangeably.

Figure 3:
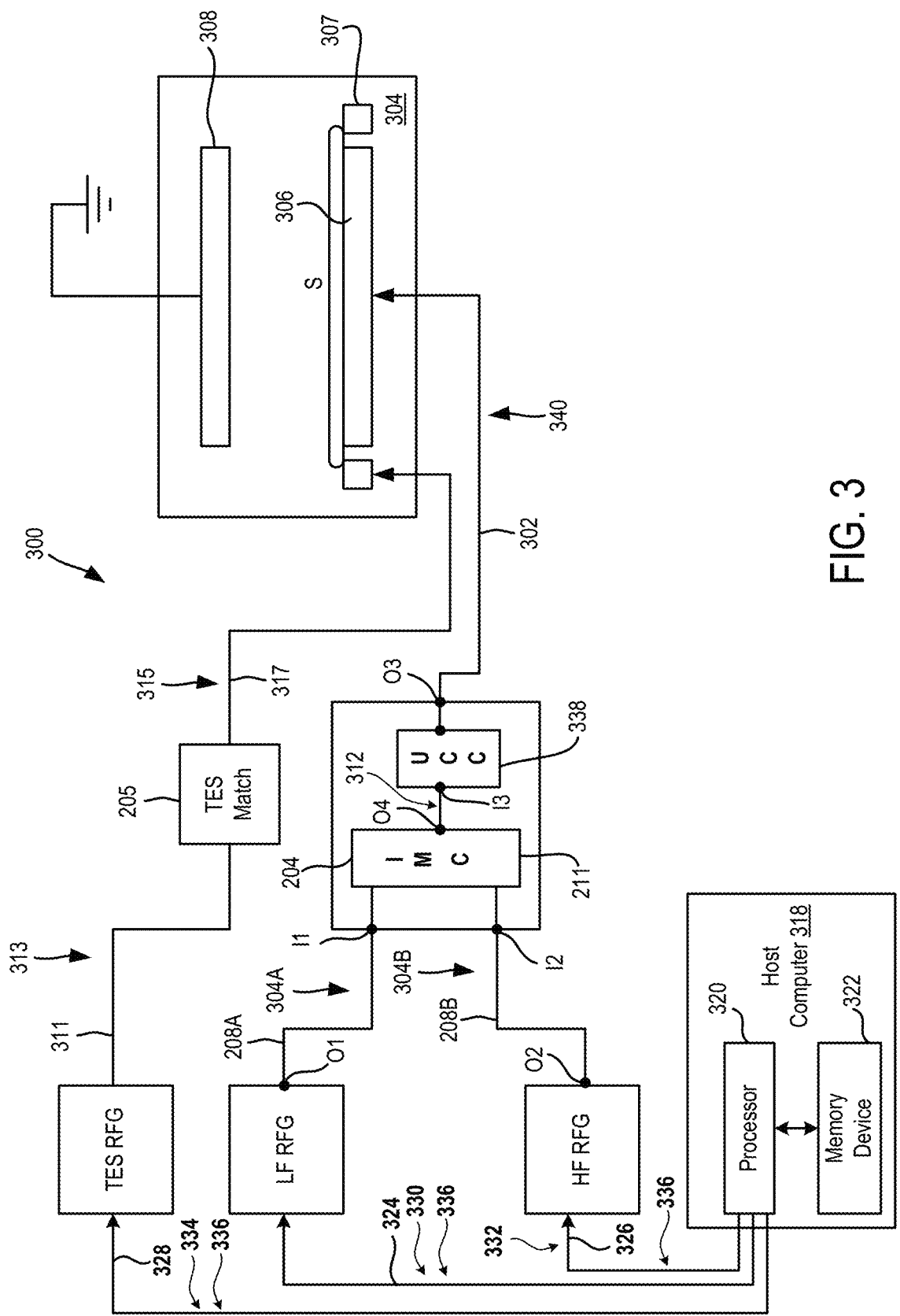
FIG. 3 is a diagram of an embodiment of a system to illustrate use of a uniformity control circuit.

FIG. 3 is a diagram of an embodiment of a system 300 to illustrate use of a uniformity control circuit 338. The system 300 includes a host computer 318, the low frequency RF generator (LF RFG), the high frequency RF generator (HF RFG), the RF cables 208A and 208B, the housing 211, an RF transmission line 302, a plasma chamber 304, and the uniformity control circuit 338. The system 300 further includes another RF generator, such as a TES RF generator. Also, the system 300 includes an RF cable 311, the TES match enclosure 205, and an RF transmission line 317.

An example of the uniformity control circuit 338 includes a capacitor, such as a fixed capacitor or a variable capacitor. Another example of uniformity control circuit 338 includes multiple capacitors. To illustrate, the uniformity control circuit 338 includes two or more capacitors coupled to each other in series. As another illustration, the uniformity control circuit 338 includes two or more capacitors coupled to each other in a parallel. As yet another illustration, the uniformity control circuit 338 includes a first group of capacitors that are coupled to each other in series and includes a second group of capacitors which are coupled to each other in parallel. The first group is coupled to the second group in series.

The TES RF generator is a low frequency or a high frequency RF generator. For example, the TES RF generator has the low frequency or the high frequency, and examples of the low frequency and the high frequency are provided above. A TES match is located within the TES match enclosure 205.

The RF transmission line 302 includes an RF rod and an RF tunnel. The RF rod is surrounded by the insulator material of the RF transmission line 302, and the insulator material is surrounded by the RF tunnel of the RF transmission line 302. Similarly, the RF transmission line 317 includes an RF rod and an RF tunnel that surrounds the RF rod. Also, an insulator material of the RF transmission line 317 surrounds the RF rod of the RF transmission line 317, and the RF tunnel of the RF transmission line 317 surrounds the insulator material of the RF transmission line 317.

The plasma chamber 304 includes a substrate support 306 and an upper electrode 308. An example of the substrate support 306 is the chuck, which includes a lower electrode. The lower electrode is made from a metal, such as aluminum or an alloy of aluminum. The substrate support 306 is made from the metal and from ceramic, such as aluminum oxide ($Al_2O_3$). The upper electrode 308 is fabricated from silicon and is coupled to a ground connection. The plasma chamber 304 further includes a TES ring 307 that surrounds the substrate support 306. The TES ring 307 is made from one or more materials, e.g., crystal silicon, polycrystalline silicon, silicon carbide, quartz, aluminum oxide, aluminum nitride, silicon nitride, etc. The TES ring 307 performs many functions, including positioning a substrate S on the substrate support 306 and shielding underlying components, such as a coupling ring, of the plasma chamber 304, that are not shielded by the substrate S from being damaged by ions of plasma formed within the plasma chamber 304. The TES ring 307 also confines the plasma to an area above the substrate S and protects the substrate support 306 from erosion by the plasma.

The host computer 318 includes a processor 320 and a memory device 322. The processor 320 is coupled to the memory device 322. As an example, a processor is a controller, or an application specific integrated circuit (ASIC), or a programmable logic device (PLD), or a central processing unit (CPU), or a microcontroller, or a microprocessor, and these terms are used interchangeably herein.

Examples of a memory device, as used herein, include a random access memory (RAM), a read-only memory (ROM), and a combination thereof.

The processor 320 is coupled via a transfer cable 324 to the LF RF generator, is coupled via a transfer cable 326 to the HF RF generator, and is coupled via another transfer cable 328 to the TES RF generator. An example of a transfer cable, as used herein, includes a cable that transfers data in a serial manner, or a cable that transfers data in a parallel manner, or a cable that transfers data using a Universal Serial Bus (USB) protocol.

An output O1 of the LF RF generator is coupled via the RF cable 208A and an input I1 of the housing 211 to a first branch circuit of the impedance matching circuit 204 within the housing 211 and an output O2 of the HF RF generator is coupled via the RF cable 208B and another input I2 of the housing 211 to a second branch circuit of the impedance matching circuit 204. An example of the input I1 is a connection, such as a solder or a weld, between the RF cable 208A and the first branch circuit. An example of the input I2 is a connection, such as a solder or a weld, between the RF cable 208B and the second branch circuit. The input I1 of the housing 211 is also an input of the first branch circuit of the impedance matching circuit 204. Also, the input I2 of the housing 211 is also an input of the second branch circuit of the impedance matching circuit 204.

The first and second branch circuits of the impedance matching circuit 204 are coupled to an output O4 of the impedance matching circuit 204. The output O4 of the impedance matching circuit 204 is coupled to an input I3 of uniformity control circuit 338. An example of the output O4 is a connection, such as a weld, between the first and second branch circuits. An output O3 of the housing 211 and of the uniformity control circuit 338 is coupled via the RF rod of the RF transmission line 302 to the lower electrode of the substrate support 306. For example, the output O3 of the uniformity control circuit 338 is coupled via a connector to the RF rod of the RF transmission line 302. Examples of a connector are provided herein.

The TES RF generator is coupled via the RF cable 311 to an input of the TES match enclosure 205. An output of the TES match enclosure 205 is coupled via the RF transmission line 317 to the TES ring 307.

The processor 320 generates a recipe signal 330 and sends the recipe signal 330 via the transfer cable 324 to the LF RF generator. As an example, a recipe signal, as used herein, sent to an RF generator includes recipe information regarding one or more power levels of an RF signal and one or more frequency levels of the RF signal to be generated by the RF generator. The recipe information further includes a duty cycle of each power level and of each frequency level. As an example, a power level includes one or more power values, and the one or more power values of a power level or exclusive from one or more power values of another power level. To illustrate, a minimum value of multiple values of a first power level is greater than a maximum value of multiple values of a second power level. The first power level is greater than the second power level. Upon receiving the recipe signal 330, the LF RF generator stores the recipe information received within the recipe signal 330 in one or more memory devices of the LF RF generator.

Similarly, the processor 320 generates a recipe signal 332 and sends the recipe signal 332 via the transfer cable 326 to the HF RF generator. Upon receiving the recipe signal 332, the HF RF generator stores the recipe information received within the recipe signal 332 in one or more memory devices of the HF RF generator.

Also, the processor 320 generates a recipe signal 334 and sends the recipe signal 334 via the transfer cable 328 to the TES RF generator. Upon receiving the recipe signal 334, the TES RF generator stores the recipe information received within the recipe signal 334 in one or more memory devices of the TES RF generator.

In addition, the processor 320 generates a trigger signal 336, and sends the trigger signal 336 via the transfer cable 324 to the LF RF generator. Also, the processor 320 sends the trigger signal 336 via the transfer cable 326 to the HF RF generator and sends the trigger signal 336 via the transfer cable 328 to the TES RF generator.

Upon receiving the trigger signal 336, the LF RF generator generates a low frequency RF signal 304A based on the recipe information received within the recipe signal 330, and sends the low frequency RF signal 304A via the RF cable 208A to the input I1 of the impedance matching circuit 204. Similarly, in response to receiving the trigger signal 336, the HF RF generator generates a high frequency RF signal 304B based on the recipe information received within the recipe signal 332, and sends the high frequency RF signal 304B by the RF cable 208B to the input I2 of the impedance matching circuit 204.

The first branch circuit of the impedance matching circuit 204 receives the low frequency RF signal 304A from the input I1, and modifies an impedance of the low frequency RF signal 304A to match an impedance of the load coupled to the output O4 with an impedance of the source coupled to the input I1 to output a first modified RF signal. An example of the load coupled to the output O4 includes the plasma chamber 304, the RF transmission line 302, and the uniformity control circuit 338. An example of the source coupled to the input I1 includes the LF RF generator and the RF cable 208A.

Similarly, the second branch circuit of the impedance matching circuit 204 receives the high frequency RF signal 304B from the input I2, and modifies an impedance of the high frequency RF signal 304B to match an impedance of the load coupled to the output O4 with an impedance of a source coupled to the input I2 to output a second modified RF signal. The first and second modified RF signals are combined, such as added at the output O4 by the impedance matching circuit 204 to output a combined RF signal 312 at the output O4. An example of the source coupled to the input I2 includes the HF RF generator and the RF cable 208B.

The combined RF signal 312 is supplied from the output O4 to the input I3 of uniformity control circuit 338. The uniformity control circuit 338 modifies an impedance of the combined RF signal 312 to achieve uniformity in a processing rate of the substrate S to output a modified RF signal 340 at the output O3. For example, the uniformity control circuit 338 is a resonant circuit provided at the output O4. To illustrate, a reactance of the uniformity control circuit 338 is adjusted to achieve the uniformity in the processing rate of the substrate S. The modified RF signal 340 is supplied from the output O3 via the RF transmission line 302 to the lower electrode of the plasma chamber 304 to strike or maintain the plasma within the plasma chamber. For example, when one or more process gases, such as an oxygen containing gas or a fluorine containing gas, are supplied to a gap between the upper electrode 308 and the substrate support 306 with the supply of the modified RF signal 340, the plasma is stricken or maintained within the plasma chamber 304.

In addition, upon receiving the trigger signal 336, the TES RFG generates an RF signal 313 based on the recipe information received within the recipe signal 334, and sends the RF signal 313 via the RF cable 311 to the input of the TES match enclosure 205. Upon receiving the RF signal 313, the TES match of the TES match enclosure 205 matches an impedance of a load coupled to the output of the TES match enclosure 205 and a source coupled to the input of the TES match enclosure 205 to output a modified RF signal 315 at the output of the TES match enclosure 205. An example of the source coupled to the input of the TES match enclosure 205 includes the TES RFG and the RF cable 311 and an example of the load coupled to the output of the TES match enclosure 205 includes the TES ring 307 and the RF transmission line 317. The TES ring 307 receives the modified RF signal 315 to process an edge region of the substrate S.

In one embodiment, the coupling ring is located below the TES ring 307 and surrounds the substrate support 306. The coupling ring is made from an electrical insulator material, e.g., a dielectric material, ceramic, glass, composite polymer, aluminum oxide, etc.

In an embodiment, the terms TES ring and tunable edge ring are used herein interchangeably.

Figure 4A:
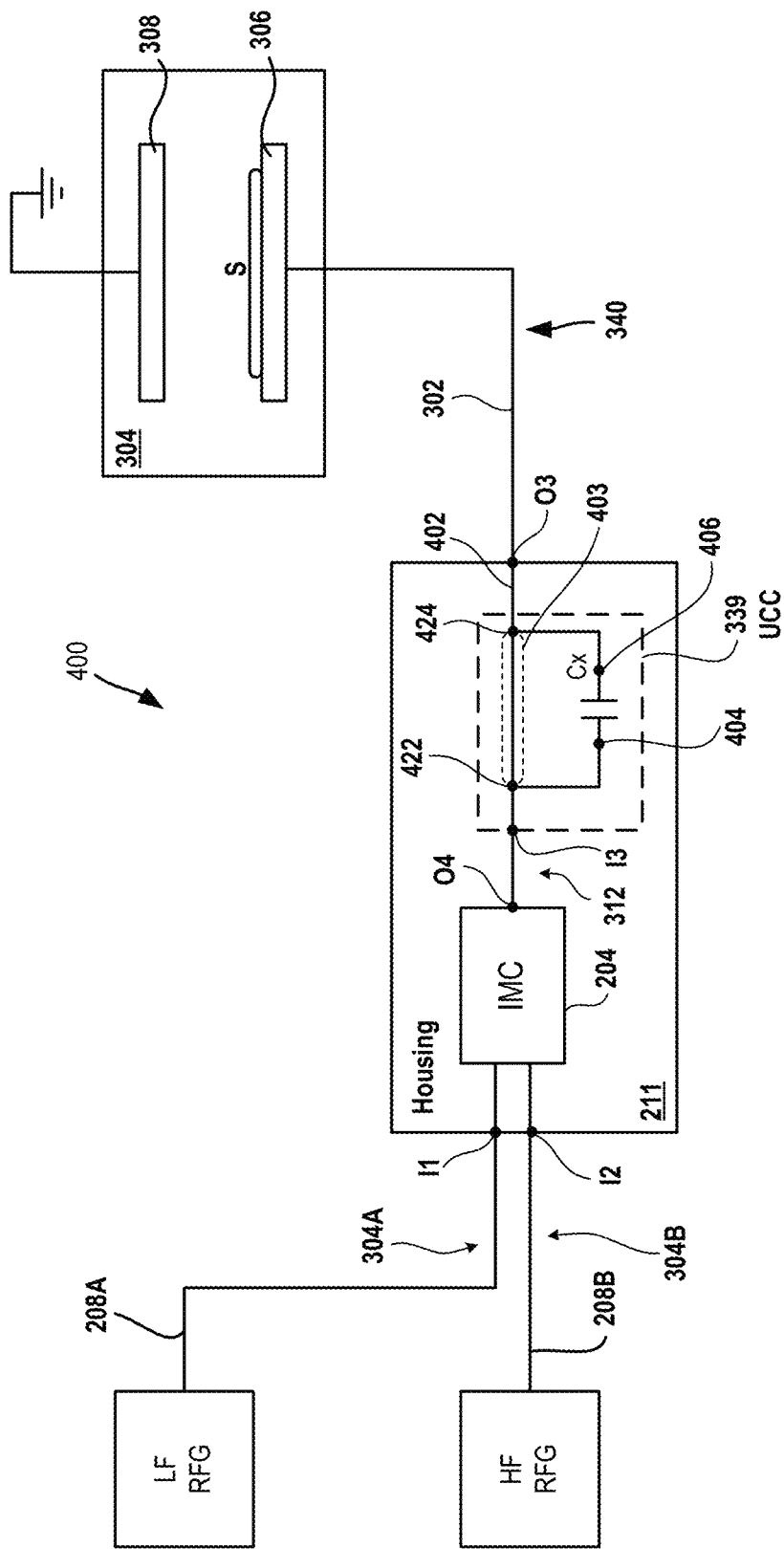
FIG. 4A is a diagram of an embodiment of a system to illustrate a uniformity control circuit that is located within a housing of an impedance matching circuit.

FIG. 4A is a diagram of an embodiment of a system 400 to illustrate a uniformity control circuit 402. The system 400 includes the LF RF generator, the HF RF generator, the housing 211, and the plasma chamber 304. The housing 211 includes a uniformity control circuit 339, which is an example of the uniformity control circuit 338 (FIG. 3). The output O4 is coupled via an RF strap 402 to the output O3. As an example, an RF strap is a metal strap that is flat and elongated. For example, the RF strap is made from copper or an alloy of copper, and has a length greater than a width and a depth of the RF strap. As another example, the RF strap is not an RF coil, such as an inductive coil, that has one or more turns.

The uniformity control circuit 339 includes a capacitor Cx and a portion 443 of the RF strap 402. As an example, a value of capacitance of the capacitor Cx ranges from 3 picoFarads (pF) to 200 pF. The capacitor Cx is a fixed capacitor and is coupled in parallel to the portion 403 the RF strap 402. For example, an end 404 of the capacitor Cx is coupled to a point 422 on the RF strap 402 an opposite end 406 of capacitor Cx is coupled to a point 424 on the RF strap 402. For example, the end 404 is coupled to the point 422 via a connector and the end 406 is coupled to the end 424 via a connector. The end 422 is coupled to the output O4 and the end 424 is coupled to the output O3. Also, none of the ends 404 and 406 of the capacitor Cx are coupled to a ground potential. The portion 403 is located between the points 422 and 424.

In one embodiment, instead of the RF strap 402, two or more RF straps are used. For example, the two or more RF straps include a first RF strap and a second RF strap. The first RF strap is coupled in series to the second RF strap via a connector, examples of which are provided below. In this example, the point 422 is located on the first RF strap and the point 424 is located on the second RF strap.

Figure 4B:
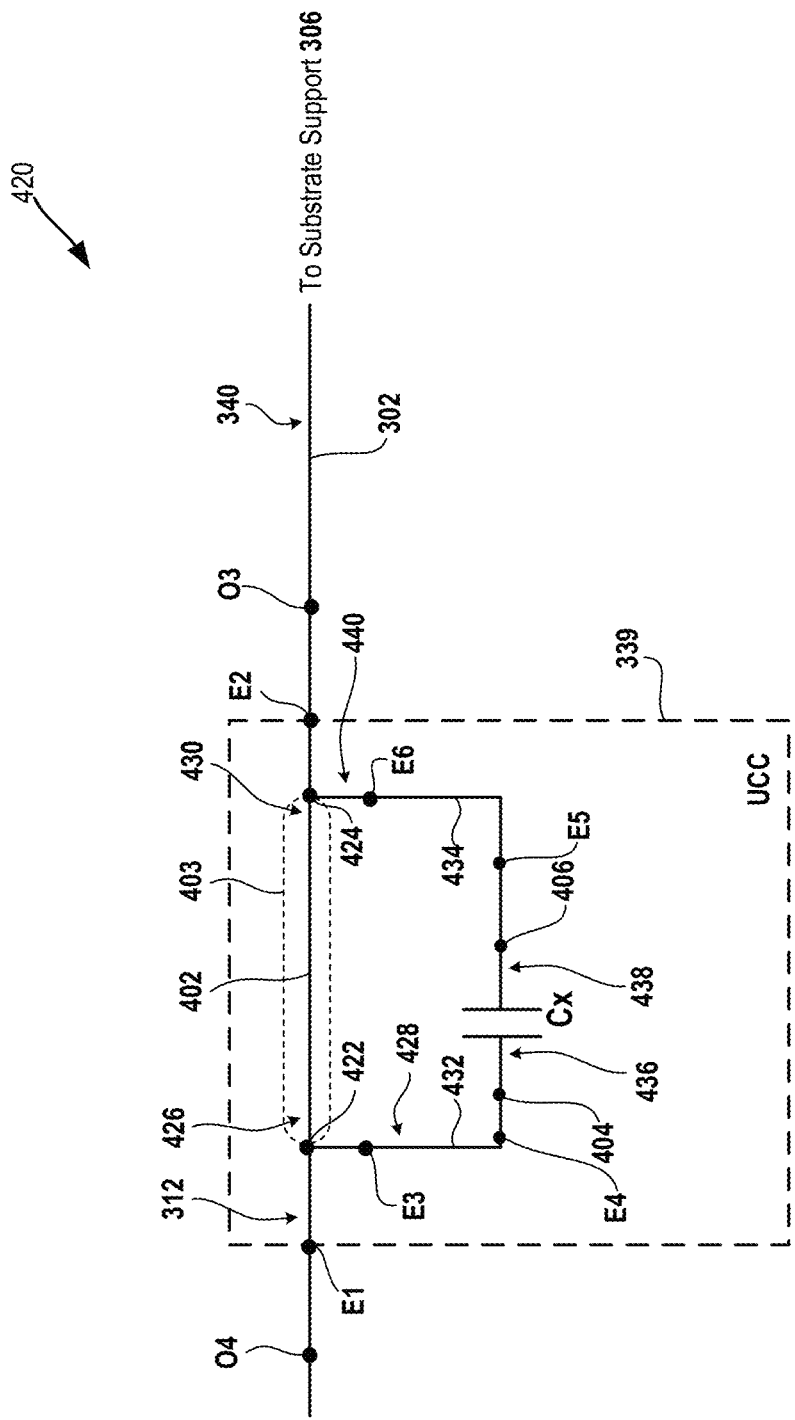
FIG. 4B is an embodiment of a system to illustrate operation of the uniformity control circuit of FIG. 4A.

FIG. 4B is an embodiment of a system 420 to illustrate operation of the uniformity control circuit 339. The RF strap 402 extends from an end E1 of the RF strap 402 to an opposite end E2 of the RF strap 402. The end E1 is an example of the input I3 of the uniformity control circuit 338 (FIG. 3). The end E1 is coupled to the output O4 via a connector. Also, the end E2 is coupled to the output O3 via a connector. An example of a connector includes one or more screws. Another example of a connector includes one or more screws and one or more nuts to fasten two components together.

Also, the uniformity control circuit 339 includes another RF strap 432, which extends from an end E3 of the RF strap 432 to an opposite end E4 of the RF strap 432. The end E3 is coupled to the point 422 via a connector, such as one or more screws. The end E4 is coupled to the end 404 of the variable capacitor Cx via a connector.

The uniformity control circuit 339 includes yet another RF strap 434, which extends from an end E5 of the RF strap 434 to an opposite end E6 of the RF strap 434. The end E6 is coupled to the point 424 via a connector. The end E5 is coupled to the end 406 of the variable capacitor Cx via a connector.

The combined RF signal 312 is split at the point 422 into a combined RF signal 426 and another combined RF signal 428. The point 422 on the RF strap 402 is coupled to the output O4 and to the end 404 of the capacitor Cx. The point 422 is coupled to the end 404 of the capacitor Cx via the RF strap 432. When the combined RF signal 426 passes through the RF strap 402, the RF strap 402 modifies an impedance of the combined RF signal 426 to output another combined RF signal 430 at a point 424. The point 424 on the RF strap 402 is coupled to the output O3 and to the end 406 of the capacitor Cx. The point 424 is coupled to the end 406 of the capacitor Cx via the RF strap 434.

When the combined RF signal 428 passes through the RF strap 432, the RF strap 432 modifies an impedance of the combined RF signal 428 to output a combined RF signal 436 at the end E4. When the combined RF signal 436 passes through the capacitor Cx, the capacitor Cx changes an impedance of the combined RF signal 436 to output a combined RF signal 438 at the end 406. The combined RF signal 438 passes through the RF strap 434. When the combined RF signal 438 passes through the RF strap 434, the RF strap 434 changes an impedance of the RF signal 438 to output a combined RF signal 440 at the end E6. The combined RF signal 430 is combined, such as added, to the combined RF signal 440 at the point 424 to output the modified RF signal 340 at the output O3.

In one embodiment, the capacitor Cx is coupled in parallel to the RF strap 402. For example, the capacitor Cx is coupled to the RF strap 432, and the RF strap 432 is coupled via a connector to the end E1 of the RF strap 402 instead of to the point 422 on the RF strap 402. Also, the capacitor Cx is coupled to the RF strap 434, and the RF strap 434 is coupled via a connector to the end E2 of the RF strap 402 instead of to the point 424 on the RF strap 402.

In one embodiment, the end E2 of the RF strap 402 is the same as the output O3 of the uniformity control circuit 338 (FIG. 3) and the end E1 is the same as the output O4 of the impedance matching circuit 204. For example, the end E2 is coupled to the RF rod of the RF transmission line 302 via a connector.

Figure 4C:
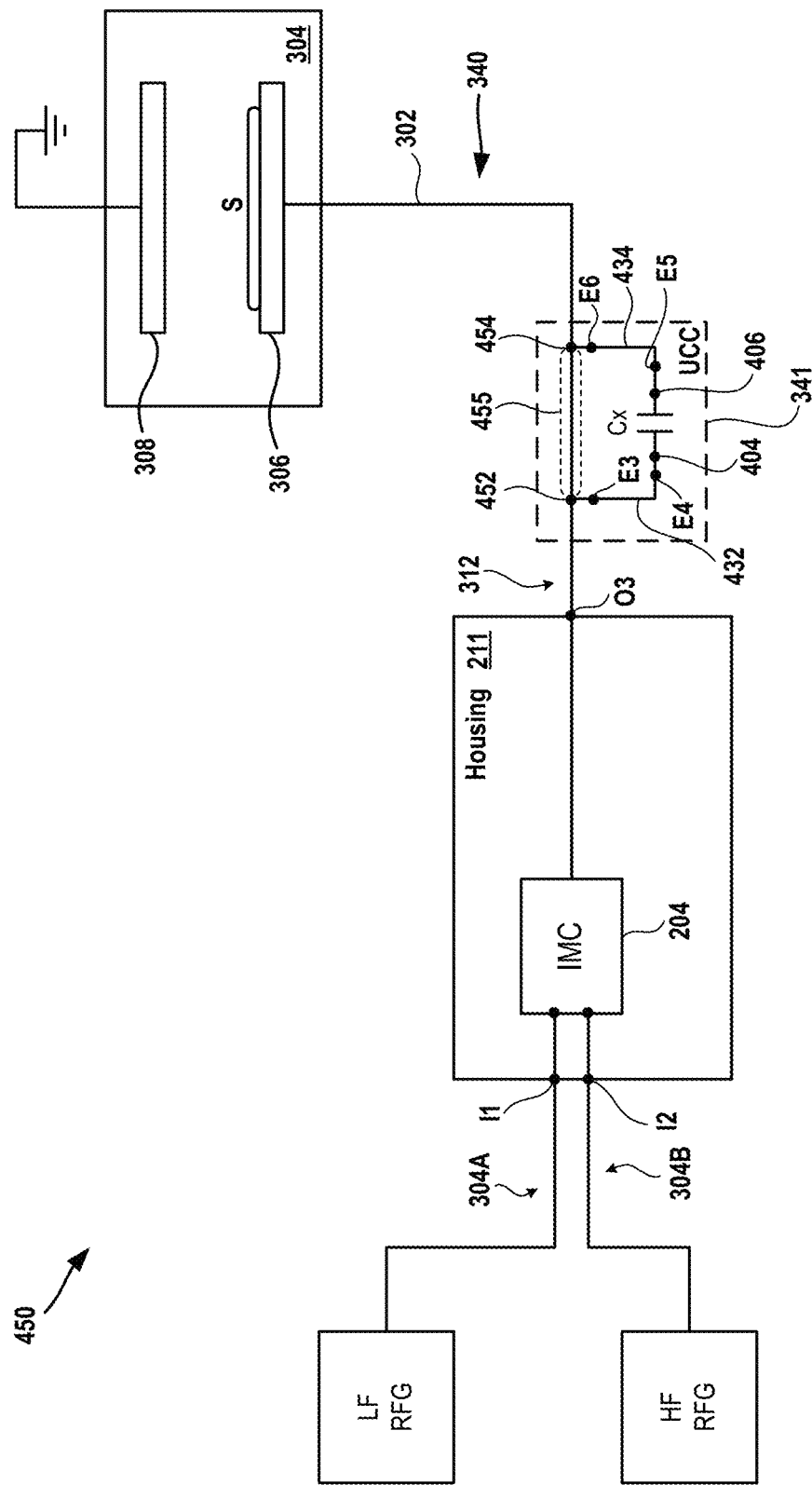
FIG. 4C is a diagram of an embodiment of a system to illustrate a uniformity control circuit that is coupled to an RF transmission line and is located outside the housing.

FIG. 4C is a diagram of an embodiment of a system 450 to illustrate a uniformity control circuit 341 that is coupled to the RF transmission line 302 and is located outside the housing 211. The system 450 includes the LF RF generator, the HF RF generator, the housing 211, the uniformity control circuit 341, and the plasma chamber 304. The uniformity control circuit 341 is the same in structure and function as the uniformity control circuit 339 (FIG. 4B) except that the uniformity control circuit 341 excludes the RF strap 402 (FIG. 4B). The uniformity control circuit 341 includes the RF strap 432, the capacitor Cx, the RF strap 434, and a portion 455 of the RF rod of the RF transmission line 302.

The uniformity control circuit 341 is coupled between the output O3 of the housing 211 and the plasma chamber 304. For example, the end 404 of the capacitor Cx is coupled to the RF strap 432, and the end E3 of the RF strap 432 is coupled at a point 452 on the RF rod of the RF transmission line 302. For example, the end E3 is coupled via a connector to the point 452. Also, the end 406 of the capacitor Cx is coupled to the RF strap 434, and the end E6 of the RF strap 434 is coupled at another point 454 on the RF rod of the RF transmission line 302. For example, the end E6 is coupled via a connector to the point 454. The capacitor Cx is coupled in parallel to the portion 455 of the RF rod of the transmission line 302 between the points 452 and 454.

Figure 5A:
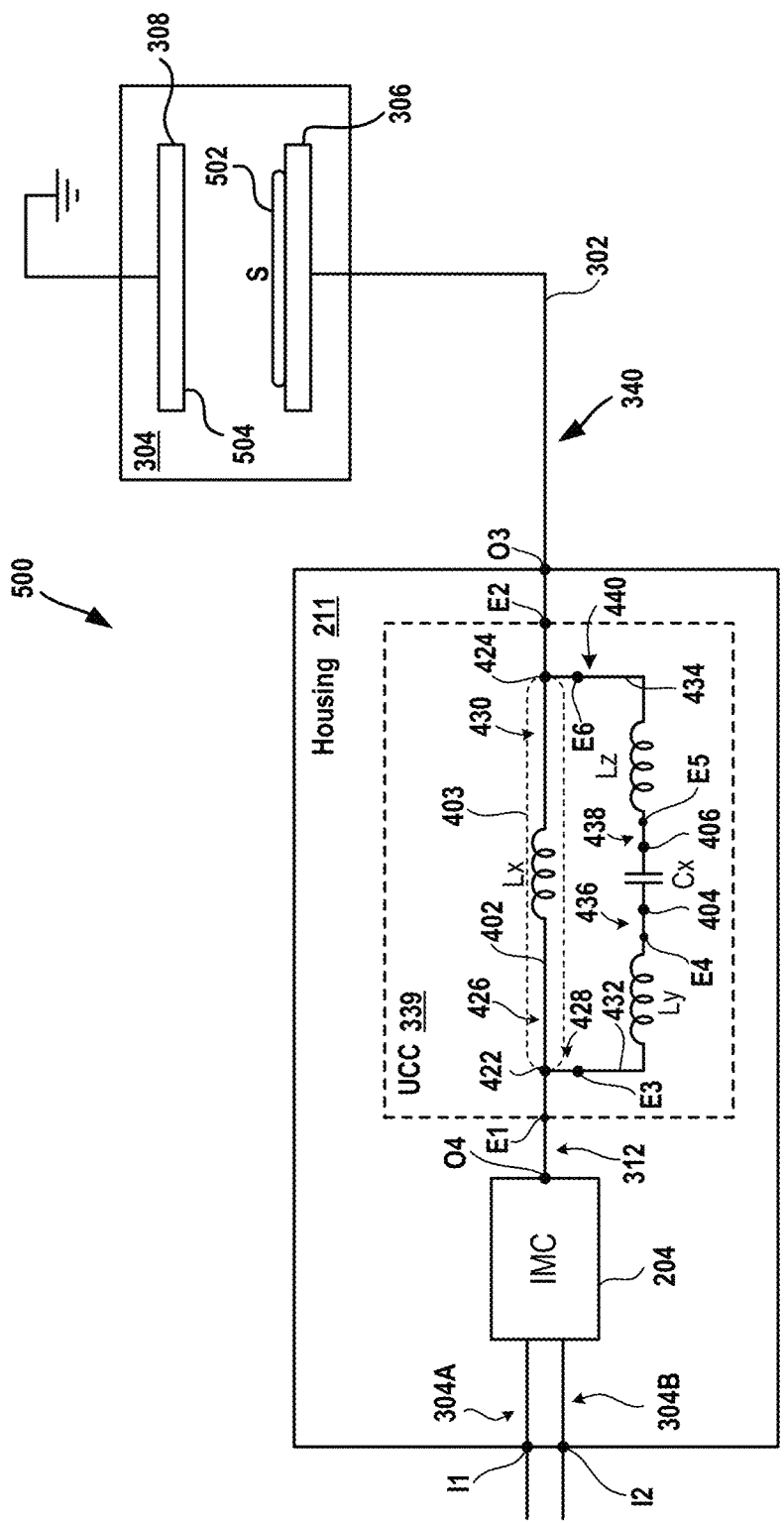
FIG. 5A is a diagram of an embodiment of a system to illustrate details of the uniformity control circuit of FIG. 4A.

FIG. 5A is a diagram of an embodiment of a system 500 to illustrate details of the uniformity control circuit 339. The RF strap 402 of the uniformity control circuit 339 has an internal inductance Lx. Also, the RF strap 432 has an internal inductance Ly and the RF strap 434 has an internal inductance Lz. The internal inductance Lx is of a low amount. Similarly, the internal inductances Ly and Lz are of low amounts. To illustrate, the internal inductance Lx ranges from 5 nanoHenries (nH) to 50 nH, the internal inductance Ly ranges from 5 nH to 20 nH, and the internal inductance Lz ranges from 5 nH to 20 nH. To further illustrate, each of the internal inductances Lx, Ly, and Lz is the same. As another illustration, the internal inductances Lx, Ly, and Lz are different from each other.

The low amount of internal inductance Lx provides a low amount of impedance to a high frequency of the combined RF signal 426. Also, the low amount of internal inductance Ly provides a low amount of impedance to the high frequency of the combined RF signal 428, and the low amount of internal inductance Lz provides a low amount of impedance to the high frequency of the combined RF signal 438. Each combined RF signal 426, 428, and 438 has the high frequency that modifies a low frequency of the combined RF signal. The low frequency is of the RF signal 304A.

Similarly, each combined RF signal 312, 436, 430, and 440 has the high frequency that modifies the low frequency of the combined RF signal. Also, the modified RF signal 340 has the high frequency that modifies the low frequency of the modified RF signal 340.

An example of the high frequency includes a MHz frequency. To illustrate, the high frequency includes a frequency of 27 MHz or greater. To further illustrate, the high frequency includes a frequency that ranges from 27 MHz to 100 MHz. As another illustration, the high frequency includes a frequency that ranges from 50 MHz to 65 MHz. The low amount of impedances offered by the internal inductances Lx, Ly, and Lz results in a first amount of power delivered by the modified RF signal 340 to the lower electrode of the substrate support 306. The first amount of power delivered to the lower electrode of the substrate support 306 is greater than a second amount of power delivered to the lower electrode. The second amount of power is delivered with higher amount of impedances offered by one or more inductive coils with greater inductances that the internal inductances Lx, Ly, and Lz. The high frequency is of the RF signal 304B that is generated by the HF RF generator (FIG. 3). Also, the high frequency is a frequency of operation of the HF RF generator.

A capacitance C1a of the capacitor Cx corresponds to a uniformity UNFM1 in a processing rate, e.g., an etch rate, a deposition rate, etc., across a top surface 502 of the substrate S. The top surface 502 faces a bottom surface 504 of the upper electrode 308. Also, the top surface 502 of the substrate S does not touch the substrate support 306 when the substrate S is placed on the substrate support 306. The top surface 502 is located on a side opposite to a bottom surface of the substrate S, and the bottom surface of the substrate S touches the substrate support 306. The capacitor Cx is manually replaced, by a user, with another capacitor, such as a fixed capacitor, to change the capacitance of the capacitor Cx to another capacitance C2a. The other capacitance C2a corresponds to another uniformity, e.g., UNFM2, in the processing rate.

In one embodiment, there is no use of a primary inductive coil in place of the RF strap 402, a secondary inductive coil in place of the RF strap 432, and a tertiary inductive coil in place of the RF strap 434. The primary, secondary, and tertiary inductive coils provide a larger amount of inductance compared to inductances provided by the RF straps 402, 432, and 434. For example, the primary inductive coil has a higher amount of inductance than an inductance of the RF strap 402, the secondary inductive coil has a higher amount of inductance than an inductance of the RF strap 432, and the tertiary inductive coil has a higher amount of inductance than an inductance of the RF strap 434.

In an embodiment, a first inductive coil is used in place of the RF strap 402, a second inductive coil is used in place of the RF strap 432, and a third inductive coil is used in place of the RF strap 434. The first, second, and third inductive coils provide the same amount of inductances as those provided by the RF straps 402, 432, and 434. For example, the first inductive coil has the same amount of inductance as the inductance of the RF strap 402, the second inductive coil has the same amount of inductance as the inductance of the RF strap 432, and the third inductive coil has the same amount of inductance as the inductance of the of the RF strap 434.

Figure 5B:
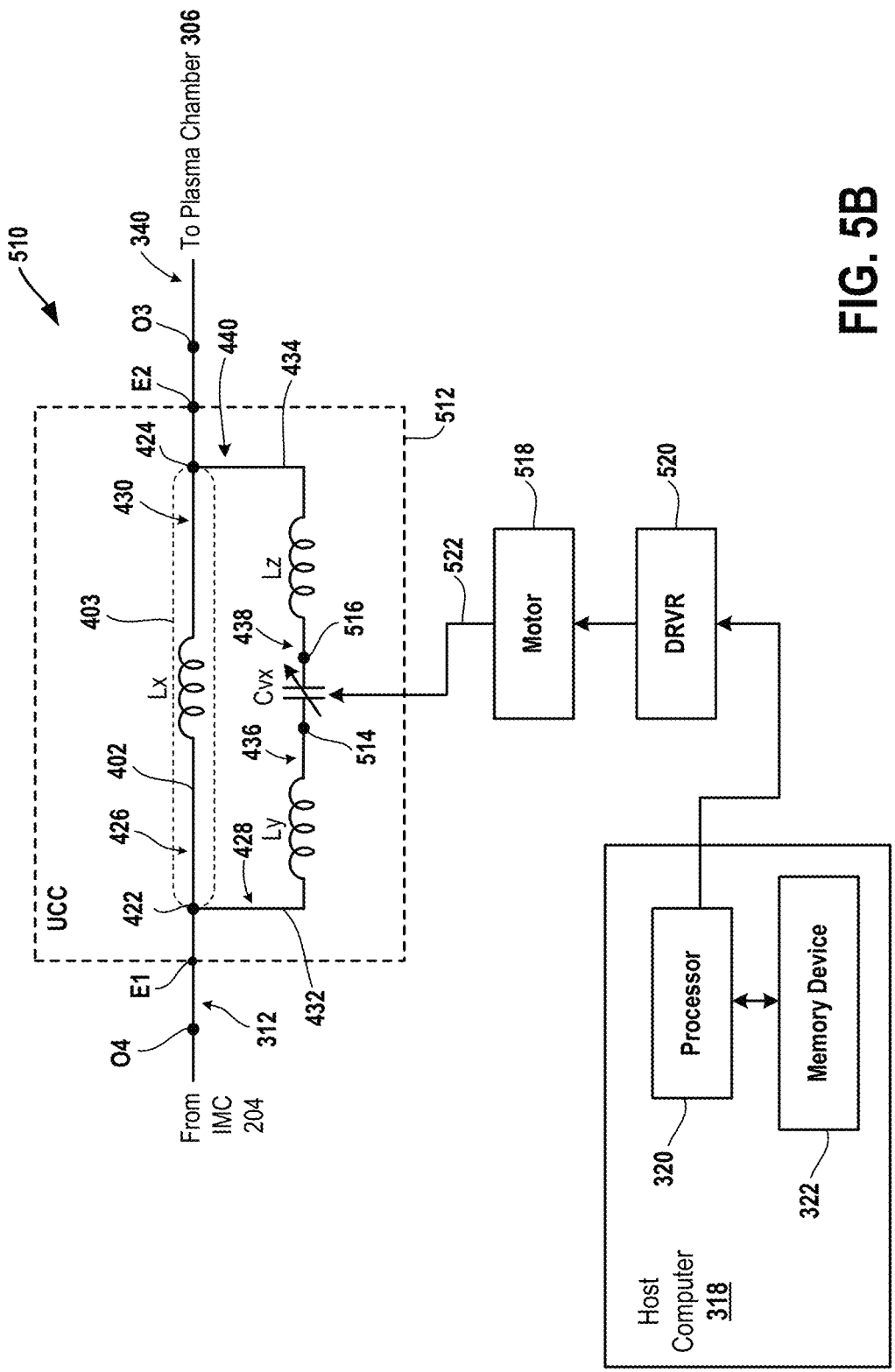
FIG. 5B is a diagram of an embodiment of a system to illustrate control of a variable capacitor of a uniformity control circuit.

FIG. 5B is a diagram of an embodiment of a system 510 to illustrate control of a variable capacitor Cvx of a uniformity control circuit 512. The uniformity control circuit 512 is the same in structure and function as the uniformity control circuit 339 (FIG. 4A) except that the uniformity control circuit 512 includes the variable capacitor Cvx in place of the capacitor Cx.

The uniformity control circuit 512 includes the portion 403 of the RF strap 402, and the RF straps 432 and 434. The RF strap 402 is coupled to an end 514 of the variable capacitor Cvx and the RF strap 434 is coupled to an opposite end 516 of the variable capacitor Cvx. The system 510 includes a motor 518, a driver 520, and the host computer 318. An example of the motor 518 is a direct current (DC) electric motor. Another example of the motor 518 is an alternating current (AC) electric motor. An example of the driver 520 includes one or more transistors, and the transistors are coupled to each other.

The processor 320 is coupled to the driver 520, which is coupled to the motor 518. The motor 518 is coupled to the variable capacitor Cvx via a connection mechanism 522. An example of the connection mechanism 522 includes one or more rods, or a combination of two or more rods and one or more gears. Each gear couples one rod to another rod.

The processor 320 accesses the capacitance C1a of the variable capacitor Cvx from the memory device 322, and generates a control signal representing the capacitance C1a of the variable capacitor Cvx. The capacitance C1a of the variable capacitor Cvx corresponds to the uniformity UNFM1. The processor 320 sends the control signal to the driver 520. In response to receiving the control signal, the driver 520 generates a current signal based on the control signal, and sends the current signal to the motor 518. A rotor of the motor 518 rotates with respect to a stator of the motor 518 to operate the motor 518. When the motor 518 operates, the variable capacitor Cvx is controlled to achieve the capacitance C1a that is represented by the control signal sent from the processor 320 to the driver 520. For example, one plate of the variable capacitor Cvx rotates with a respect to another plate of the variable capacitor Cvx to change an area of overlap between the two plates to achieve the capacitance C1a. When the variable capacitor Cvx has the capacitance C1a corresponds to the uniformity UNFM1, an impedance of the combined RF signal 436 is modified and the variable capacitor Cvx outputs the combined RF signal 438. Similarly, the processor 320 controls the variable capacitor Cvx to change the capacitance C1a to the other capacitance C2a to achieve the uniformity UNFM2.

Figure 5C:
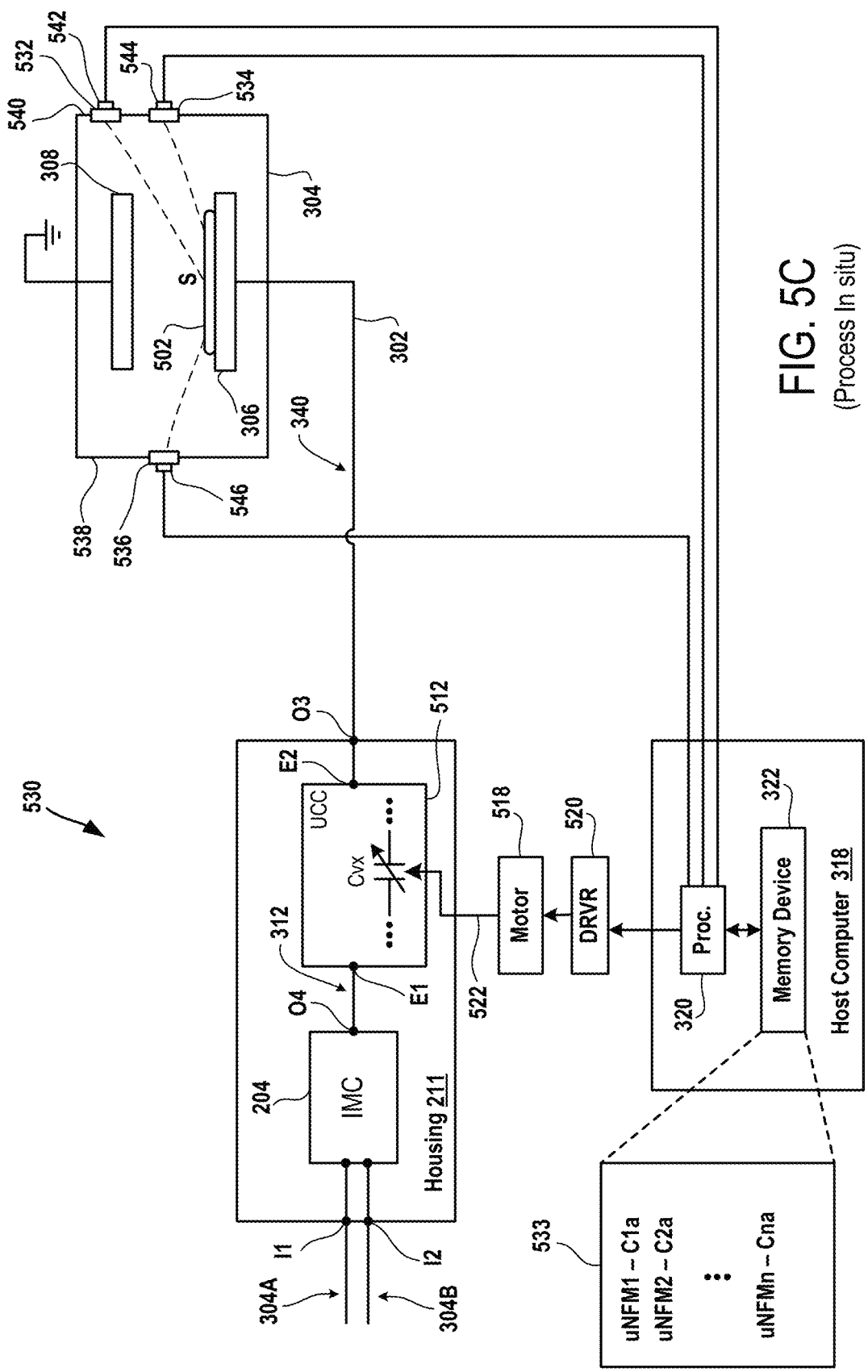
FIG. 5C is a diagram of an embodiment of a system to illustrate an in-situ method used to control the variable capacitor to achieve a pre-determined uniformity in a processing rate across a top surface of a substrate.

FIG. 5C is a diagram of an embodiment of a system 530 to illustrate control of the variable capacitor Cvx to achieve a pre-determined uniformity in a processing rate across the top surface 502 of the substrate S. The system 530 is used to illustrate an in situ method for achieving uniformity in a processing rate across the top surface 502 of the substrate S while the substrate S is being processed within the plasma chamber 304. The uniformity is achieved by controlling a capacitance of the variable capacitor Cvx.

The system 530 includes the housing 211, the host computer 318, and the plasma chamber 304. The plasma chamber 304 includes multiple windows 532, 534, and 536. For example, the window 532 is embedded within a left side wall 538. Also, the windows 534 and 536 are embedded within a right side wall 540 of the plasma chamber 304.

An etch rate measurement device (ERMD) is placed at each window of the plasma chamber 304. For example, an ERMD 542 placed adjacent to or fixed to the window 532 to have a line of sight to an inside volume of the plasma chamber 304. Similarly, an ERMD 544 placed adjacent to or fixed to the window 534 to have a line of sight to the inside volume of the plasma chamber 304 and an ERMD 546 placed adjacent to or fixed to the window 536 to have a line of sight to the inside volume of the plasma chamber 304. To illustrate, the ERMD 542 is placed at a horizontal level that is above a horizontal level at which the above the ERMDs 544 and 546 are placed to have a line of sight to a central region of the substrate S. The ERMD 544 is placed adjacent to the side wall 540 to have a line of sight to a right edge region of the substrate S. Also, the ERMD 546 is placed adjacent to the side wall 538 to have a line of sight to a left edge region of the substrate S. The left edge region and the right edge region of the substrate S are located on opposite sides of the central region of the substrate S. An example of an ERMD is an optical emission spectrometer (OES).

The ERMD 546 is coupled via a cable to the processor 320. Similarly, the ERMD 542 is coupled via a cable to the processor 320 and the ERMD 544 is coupled via a cable to the processor 320.

A table 533 including correspondences between uniformities in processing rates and capacitances of the variable capacitor Cvx is stored within the memory device 322. For example, the table 533 includes a correspondence, such as a one-to-one link or a one-to-one association or a one-to-one mapping, between the uniformity UNFM1 and the capacitance C1a. Also, the table 533 includes a correspondence between the uniformity UNFM2 and the capacitance C2a and a correspondence between uniformity UNFMn and a capacitance Cna, where n is a positive integer.

As explained about with respect to FIG. 5B, the processor 320 controls the variable capacitor Cvx to achieve the capacitance C1a during processing of the substrate S. For example, the substrate S is cleaned, polished, etched, or materials are deposited on the substrate S during fabrication of the substrate S.

While of the substrate S is being processed by the plasma that is generated in the plasma chamber 304, the ERMD 546 generates an electrical signal that represents an intensity of light that is detected by the ERMD 546. The light detected by the ERMD 546 is reflected from the left region of the substrate S towards the ERMD 546. The electrical signal output from the ERMD 546 is sent to the processor 320.

Similarly, the ERMD 542 generates an electrical signal that represents an intensity of light that is detected by the ERMD 542. The light detected by the ERMD 542 is reflected from the central region of the substrate S towards the ERMD 542. The electrical signal output from the ERMD 542 is sent to the processor 320. Also, the ERMD 544 generates an electrical signal that represents an intensity of light that is detected by the ERMD 544. The light detected by the ERMD 544 is reflected from the right region of the substrate S towards the ERMD 544. The electrical signal output from the ERMD 544 is sent to the processor 320. The electrical signals output from the ERMDs 546, 542, and 544 represent the intensities of light reflected from the left region, the central region, and the right region of the substrate S, The processor 320 receives the electrical signals from the ERMDs 542, 544, and 546 and determines from the electrical signals an amount of the substrate S left in the left region, the central region, and the right region at a time t1. In a similar manner, the processor 320 receives additional electrical signals from the ERMDs 542, 544, and 546 and determines from the additional electrical signals an amount of the substrate S left in the left region, the central region, and the right region at a time t2. The additional electrical signals received from the ERMDs 542, 544, and 546 represent intensities of light reflected from the left region, the central region, and the right region of the substrate S.

The processor 320 determines a first processing rate at the left region of the substrate as a ratio of a first difference and a second difference. The first difference is a difference between the amount of the substrate S left at the left region at the time t2 and the amount of the substrate S left at the left region at the time t1. The second difference is a difference between the times t2 and t1. Similarly, the processor 320 determines a second processing rate at the central region of the substrate as a ratio of a third difference and the second difference. The third difference is a difference between the amount of the substrate S left at the central region at the time t2 and the amount of the substrate S left at the central region at the time t1. Also, the processor 320 determines a third processing rate at the right region of the substrate as a ratio of a fourth difference and the second difference. The fourth difference is a difference between the amount of the substrate S left at the right region at the time t2 and the amount of the substrate S left at the right region at the time t1.

The processor 320 determines uniformity, such as a measured uniformity, across the top surface 502 of the substrate S as having the first, second, and third processing rates. The processor 320 accesses the uniformity UNFM1 corresponding to the capacitance C1a from the table 533 and determines whether the measured uniformity is within a predetermined range, such as within ±0.5%, from the uniformity UNFM1. For example, the processor 320 compares the measured uniformity with the uniformity UNFM1 to determine that the measured uniformity matches the uniformity UNFM1. An example of the predetermined range is a range of values of the measured uniformity from −0.25% of the uniformity UNFM1 to 0.25% of the uniformity UNFM1. Another example of the predetermined range is a range of values of the measured uniformity from −0.5% of the uniformity UNFM1 to 0.5% of the uniformity UNFM1. Upon determining that the measured uniformity matches the uniformity UNFM1, the processor 320 determines that the measured uniformity is within the predetermined range from the uniformity UNFM1. On the other hand, upon determining that the measured uniformity does not match the uniformity UNFM1, the processor 320 determines that the measured uniformity is not within the predetermined range from the uniformity UNFM1. As another example, the processor 320 compares the measured uniformity and the uniformity UNFM1 to determine that a pre-determined number of values, such as greater than 70% or 75% or 80% of the values, of the measured uniformity are within the pre-determined range from the pre-determined number of values of the uniformity UNFM1. Upon determining so, the processor 320 determines that the measured uniformity is within the predetermined range from the uniformity UNFM1. On the other hand, upon determining that the pre-determined number of values of the measured uniformity are not within the pre-determined range from the pre-determined number of values of the uniformity UNFM1, the processor 320 determines that the measured uniformity is not within the predetermined range from the uniformity UNFM1.

On one hand, upon determining that the measured uniformity is within the predetermined range from the uniformity UNFM1, the processor 320 does not further control the variable capacitor to change the capacitance C1a of the variable capacitor Cvx. On the other hand, in response to determining that the measured uniformity is not within the predetermined range from the uniformity UNFM1, the processor 320 controls the variable capacitor Cvx to change a capacitance of the variable capacitor Cvx, and uniformity in a processing rate across the top surface 502 of the substrate S is measured again and compared with the uniformity UNFM1. In this manner, the processor 320 continues to control the variable capacitor Cvx until a measurement of uniformity is within the predetermined range from the uniformity UNFM1. In this manner, the processor 320 controls the variable capacitor Cvx to achieve the capacitance values C2a through Cna for achieving the corresponding uniformities UNFM2 through UNFMn in processing rates across the top surface 502 of the substrate S.

In one embodiment, the plasma chamber 304 has a side wall of an annular shape. In this embodiment, the left side wall 538 is a left portion of the side wall and the right side wall 540 is a right portion of the side wall.

In an embodiment, the in situ method, described above with reference to FIG. 5C, is performed in a lab to determine the capacitances C1a through Cna and corresponding uniformities UNFM1 through UNFMn. For example, instead of the substrate S, a dummy substrate S is used. The dummy substrate is representative of multiple substrates to be processed in the plasma chamber 304. For example, the dummy substrate has the same structure, e.g., a set of layers, as the multiple substrates. When the dummy substrate is placed within the plasma chamber 304, the processor 320 controls the variable capacitor Cvx to achieve the capacitance C1a. Once the capacitance C1a is achieved, the ERMDs 542, 544, and 546 measure light intensities at the right, central, and left regions of the dummy substrate to output electrical signals. Based on the electrical signals, the processor 320 determines the uniformity UNFM1 in a processing rate across a top surface of the dummy substrate, and maps the uniformity UNFM1 to the capacitance C1a. The mapping between uniformity UNFM1 and the capacitance C1a is stored in the table 533 of the memory device 322 by the processor 320.

In a similar manner, the processor 320 creates multiple mappings between the capacitances C2a through Cna and the uniformities UNFM2 through UNFMn for the dummy substrate, and stores the mappings in the table 533. Once the table 533 having the mappings between the uniformities is created in the lab, the processor 320 applies the table 533 to process the multiple substrates to achieve one of the uniformities UNFM1 through UNFMn. For example, while processing one of the multiple substrates, the processor 320 receives an input from a user via an input device. The input indicates the uniformity UNFM1. The processor 320 controls the variable capacitor Cvx to achieve the capacitance C1a corresponding to the uniformity UNFM1. The input device is coupled to the processor 320. Examples of the input device include a touchscreen, a keyboard, a keypad, and a stylus.

In one embodiment, the measured uniformity includes amounts of the substrate S left at more or less than three regions. For example, the measured uniformity includes an amount of the substrate S left at a region of the substrate S between the central region of the substrate S and the right region of the substrate S and an amount of the substrate S left at a region between the central region of the substrate S and the left region of the substrate S.

In one embodiment, the plasma chamber 304 has any other number of windows on the side wall 538 or 540, and the same number of ERMDs. Each ERMD is placed with respect to a corresponding one of the windows to detect optical emissions from plasma within the plasma chamber 304. For example, the side wall 538 has two windows and two ERMDs, and the side wall 540 has one window and one ERMD.

Figure 5D:
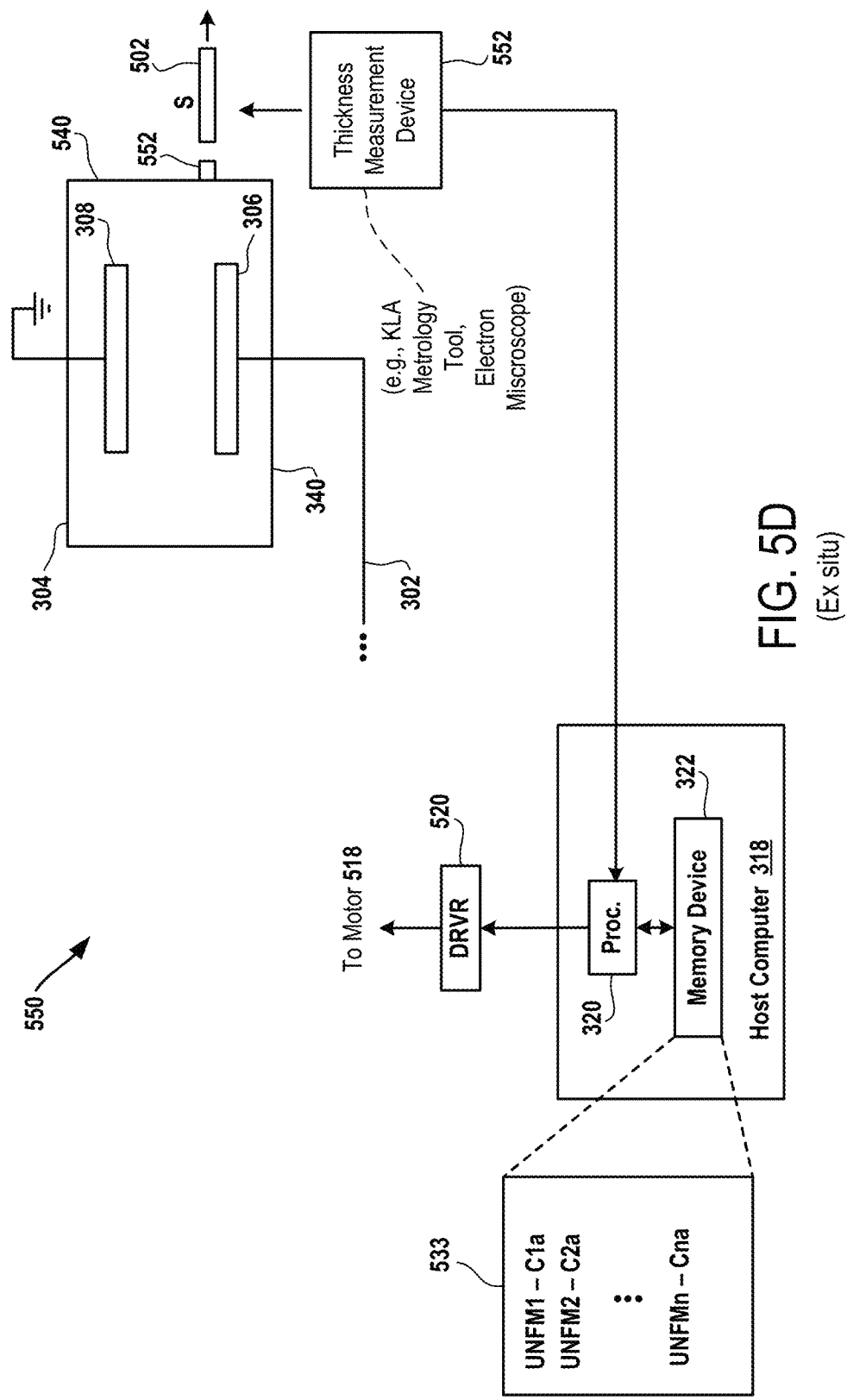
FIG. 5D is a diagram of an embodiment of a system to illustrate an ex-situ method used to control the variable capacitor to achieve a pre-determined uniformity in a processing rate across a top surface of a substrate.

FIG. 5D is a diagram of an embodiment of a system 550 to illustrate an ex situ process for achieving uniformity in a processing rate of the substrate S. The system 550 is similar or the same in structure and function as the system 530 of FIG. 5C except that in the system 550, a thickness measurement device 550 is used instead of the ERMDs 542, 544, and 546 (FIG. 5C). The thickness measurement device 550 facilitates the ex situ process.

Examples of the thickness measurement device 522 includes an electron microscope and a metrology tool available from KLA™ corporation. The thickness measurement device 522 is coupled to the processor 320 via a cable.

The processor 320 controls the variable capacitor Cvx to achieve the capacitance C1 to further achieve the uniformity UNFM1 across the top surface 502 of the substrate S, which is being processed within the plasma chamber 304. After the substrate S is processed within the plasma chamber 304, the substrate S is removed via an opening 552 in the side wall 540 from the plasma chamber 304. The user uses the thickness measurement device 552 to measure a thickness TL of the substrate S at the left region of the substrate S, a thickness TC of the substrate S at the central region of the substrate S, and a thickness TR of the substrate S at the right region of the substrate S. The user provides a calculated uniformity, which includes the thicknesses TL, TC, and TR, to the processor 320 via the input device.

The processor 320 determines whether the calculated uniformity is within the predetermined range from the uniformity UNFM1. For example, the processor 320 compares the calculated uniformity with the uniformity UNFM1 to determine that the calculated uniformity matches the uniformity UNFM1. Upon determining that the calculated uniformity matches the uniformity UNFM1, the processor 320 determines that the calculated uniformity is within the predetermined range from the uniformity UNFM1. On the other hand, upon determining that the calculated uniformity does not match to uniformity UNFM1, the processor 320 determines that the calculated uniformity is not within the predetermined range from the uniformity UNFM1. As another example, the processor 320 compares the calculated uniformity and the uniformity UNFM1 to determine that a pre-determined number of values, such as greater than 70% or 75% or 80% of the values, of the calculated uniformity are within the pre-determined range from the pre-determined number of values of the uniformity UNFM1. Upon determining so, the processor 320 determines that the calculated uniformity is within the predetermined range from the uniformity UNFM1. On the other hand, upon determining that the pre-determined number of values of the calculated uniformity are not within the pre-determined range from the pre-determined number of values of the uniformity UNFM1, the processor 320 determines that the calculated uniformity is not within the predetermined range from the uniformity UNFM1.

On one hand, upon determining that the calculated uniformity is within the predetermined range from the uniformity UNFM1, the processor 320 does not further control the variable capacitor to change the capacitance C1$a$ of the variable capacitor Cvx. On the other hand, in response to determining that the calculated uniformity is not within the predetermined range from the uniformity UNFM1, the processor 320 controls the variable capacitor Cvx to change a capacitance of the variable capacitor Cvx, and uniformity in a processing rate across the top surface 502 of the substrate S is calculated again and compared with the uniformity UNFM1. In this manner, the processor 320 continues to control the variable capacitor Cvx until a calculation of uniformity is within the predetermined range from uniformity UNFM1. In this manner, the processor 320 controls the variable capacitor Cvx to achieve the capacitance values C2$a$ through Cn$a$ for achieving the corresponding uniformities UNFM2 through UNFMn in processing rates across the top surface 502 of the substrate S.

In one embodiment, the calculated uniformity includes thicknesses of the substrate S at more or less than three regions of the substrate S. For example, the calculated uniformity includes a thickness of the substrate S left at a region of the substrate S between the central region of the substrate S and the right region of the substrate S and a thickness of the substrate S left at a region between the central region of the substrate S and the left region of the substrate S.

In an embodiment, the ex situ method, described above with reference to FIG. 5D, is performed in the lab to determine the capacitances C1$a$ through Cn$a$ and corresponding uniformities UNFM1 through UNFMn. For example, instead of the substrate S, the dummy substrate S is used. When the dummy substrate S is placed within the plasma chamber 304 for processing, the processor 320 controls the variable capacitor Cvx to achieve the capacitance C1$a$. When the variable capacitor Cvx has the capacitance C1$a$, the user removes the dummy substrate S from the plasma chamber 304 and uses the thickness measurement device 552 to determine uniformity in a processing rate across a top surface of the dummy substrate. The uniformity is determined to be UNFM1. The uniformity UNFM1 is provided by the user via the input device to the processor 320 for storage in the table 533 of the memory device 322 is corresponding to the capacitance C1$a$ of the variable capacitor Cvx. In a similar manner, the processor 320 controls the variable capacitor Cvx to achieve the capacitances C2$a$ through Cn$a$, and the corresponding uniformities for a set of dummy substrates are determined. The correspondences between the sentences C2$a$ through Cn$a$ and the uniformities UNFM2 through UMFMn are stored in the table 533. The table 533 is then applied by the processor 320 to control the variable capacitor Cvx during processing of multiple substrates in the plasma chamber 304 to achieve the corresponding uniformities UNFM1 through UNFMn. For example, the processor 320 controls the variable capacitor Cvx to have the capacitance C1$a$ to achieve the uniformity UNFM1 across the top surface 502 of the substrate S and controls the variable capacitor Cvx to have the capacitance C2$a$ to achieve uniformity UNFM2 across a top surface of another substrate processed in the plasma chamber 304.

Figure 6:
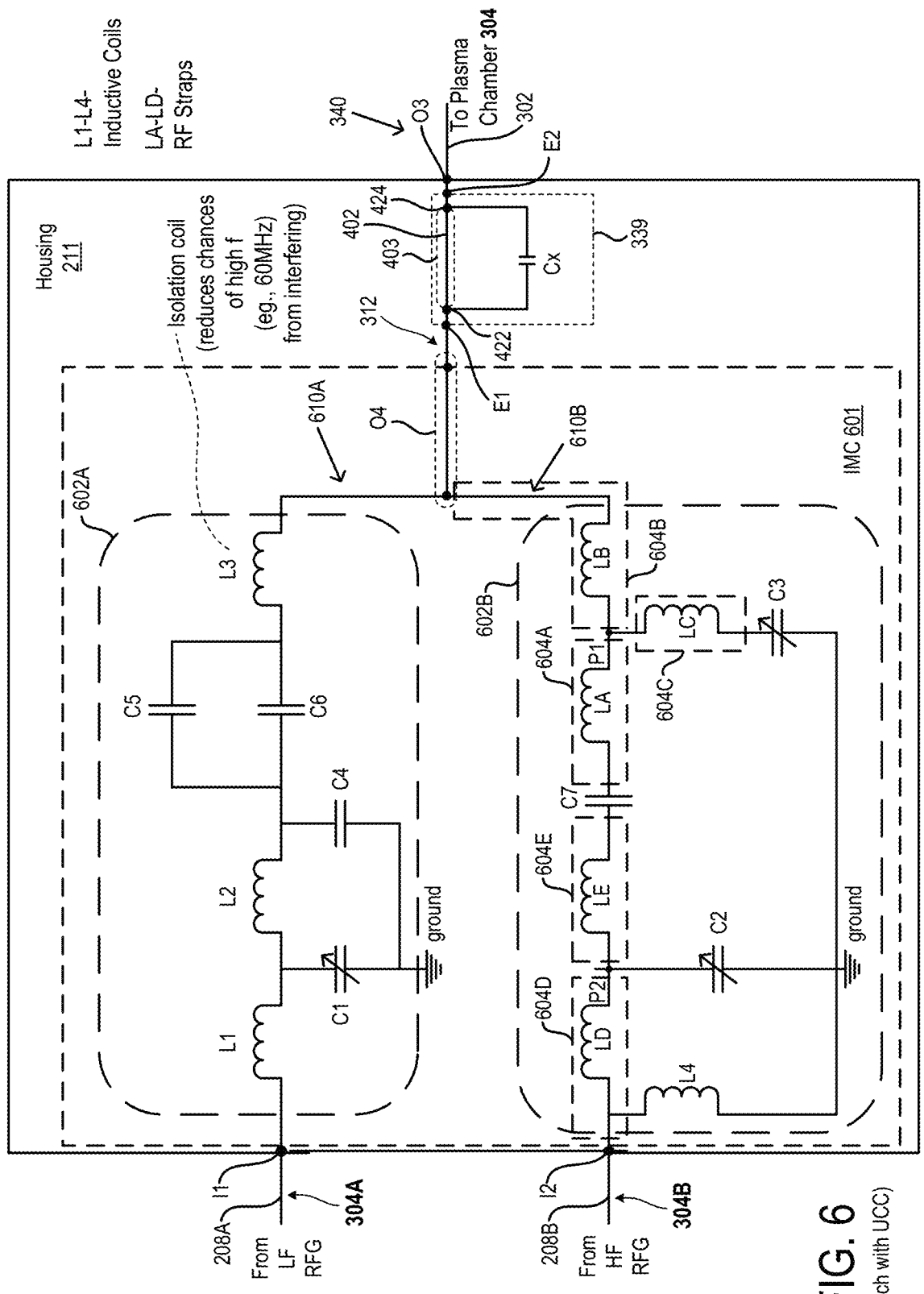
FIG. 6 is a diagram of an embodiment of an impedance matching circuit to illustrate a coupling of the uniformity control circuit of FIG. 4A to an impedance matching circuit.

FIG. 6 is a diagram of an embodiment of an impedance matching circuit 601 to illustrate a coupling of the uniformity control circuit 339 to the impedance matching circuit 601. The impedance matching circuit 601 is an example of the impedance matching circuit 204 (FIG. 3).

The impedance matching circuit 601 includes a branch circuit 602A and a branch circuit 602B. The branch circuit 602A is an example of the first branch circuit, described above with reference to FIG. 3. The branch circuit 602B is an example of the second branch circuit, described above with reference to FIG. 3. The branch circuit 602A includes circuit components, such as an inductor L1, an inductor L2, a capacitor C1, a capacitor C4, a capacitor C5, a capacitor C6, and an inductor L3. The inductor L3 is sometimes referred to as an isolation coil, which reduces chances of RF power of the RF signal 304B that passes through the branch circuit 602B from interfering with components of the branch circuit 602A. The capacitors C5 and C6 are direct current (DC) blocking capacitors, which are further described below. The branch circuit 602B includes circuit components, such as an inductor L4, a capacitor C2, a capacitor C7, and a capacitor C3. The capacitors C1, C2, and C3 are variable capacitors. C1 and C2 are main capacitors and C3 is an auxiliary capacitor. The inductors L1 through L4 are coils that are wound to form an inductor and are not RF straps.

The branch circuit 602B further includes an RF strap portion 604A, an RF strap portion 604B, an RF strap 604C, an RF strap 604D, and an RF strap 604E. The portions 604A and 604B are portions of one RF strap. As an example, an RF strap, as used herein, is a flat elongated piece of metal that is made from a conductor, such as copper or an alloy of copper. To illustrate, the RF strap has a length, a width and a thickness. The length of the RF strap is greater than the width of the RF strap and the width is greater than the thickness of the RF strap. As another illustration, the RF strap occupies a substantially rectangular volume or a rectangular volume and is flexible to be bent or re-shaped. An example of the rectangular volume is a volume occupied by a rectangular bar.

The inductor L1 is coupled to the input I1 of the housing 211 and is coupled to the inductor L2. Also, the capacitor C1 is coupled to a point that couples the inductor L1 to the inductor L2. Also, the capacitor C1 is coupled to a ground potential.

The inductor L2 is coupled to the capacitor C6 and the capacitor C4 is coupled to a point that couples the inductor L2 to the capacitor C6. The capacitor C4 is also coupled to the ground potential. The capacitor C6 is coupled in parallel to the capacitor C5. The capacitor C6 is coupled to the inductor L3, which is coupled to the output O4 of the impedance matching circuit 601.

The inductor L4 is coupled to the input I2 of the housing 211 and is coupled to the ground connection. The inductor L4 is coupled to a point on the RF strap 604D. An example of the input I2 is an end of the RF strap 604D. The capacitor C2 is coupled to a point P2 between the RF straps 604D and 604E. The RF straps 604D and 604E are connected to each other at the point P2. The capacitor C2 is also coupled to the ground connection. The capacitor C7 is coupled to the RF strap 604E and to the RF strap portion 604A.

The capacitor C3 is coupled to the RF strap 604C, which is coupled to a point P1 of the branch circuit 602B. The point P1 couples the RF strap portion 604A to the RF strap portion 604B. The RF strap portion 604A is coupled to the RF strap portion 604B at the point P1. The capacitor C3 is also coupled to the ground connection. The RF strap portion 604B is coupled to the output O4 of the impedance matching circuit 601.

Each RF strap portion 604A and 604B and each RF strap 604C-604E has a respective inductance. For example, the RF strap portion 604A has an inductance LA, the RF strap portion 604B as another inductance LB, the RF strap 604C has yet another inductance LC, the RF strap 604D has an inductance LD, and the RF strap 604E has an inductance LE. It should be noted that as an example, any of the RF strap portion 604A, the RF strap portion 604B, the RF strap 604C, the RF strap 604D, and the RF strap 604E is not wound into a coil to form an inductor but is a flat elongated piece of metal.

As an example, the inductor L1 has an inductance that ranges from 45 microHenries (µH) to 55 µH. As another example, the inductor L2 has an inductance that ranges from 35 µH to 41 µH. As yet another example, the capacitor C1 has a capacitance that ranges from 60 picoFarads (pF) to 2000 pF. As another example, the capacitor C4 has a capacitance that ranges from 110 pF to 120 pF. Also, as an example, the capacitor C5 has a capacitance that ranges from 2700 pF to 2900 pF. As another example, the inductor L3 has an inductance that ranges from 2.1 µH to 2.3 µH.

As yet another example, the inductor L4 has an inductance that ranges from 0.44 µH to 0.46 µH. Also, as an example, the capacitor C2 has a capacitance that ranges from 25 pF to 250 pF. As another example, the capacitor C7 has a capacitance that ranges from 7 pF to 17 pF. As yet another example, the capacitor C3 has a capacitance that ranges from 3 pF to 30 pF.

The UCC 339 is coupled between the output O4 and the output O3. For example, the UCC 339 is coupled in parallel to the portion 403 of the RF strap 402. The end E1 of the UCC 339 is coupled to the output O4 of the impedance matching circuit 601 and the end E2 is coupled to the output O3 of the housing 211.

The RF signal 304A generated by the LF RF generator is received at the input I1 and is sent via the inductor L1, the inductor L2, the capacitors C5 and C6, and the inductor L3 to the output O4. The capacitors C1, C4, C5, and C6, and the inductors L1-L3 change an impedance of the RF signal 304A received at the input I1 to output a modified RF signal 610A.

Moreover, the RF signal 304B generated by the HF RF generator is received at the input I2 and is sent via the RF strap 604D, the point P2, the RF strap 604E, the capacitor C7, the RF strap portion 604A, and the RF strap portion 604B to the output O4. The inductor L4, the RF strap 604D, the capacitor C2, the RF strap 604E, the capacitor C7, the RF strap portion 604A, the RF strap 604C, the capacitor C3, and the RF strap portion 604B modify an impedance of the RF signal 304B received at the input I2 to output a modified RF signal 610B.

The branch circuit 602A modifies an impedance of the low frequency RF signal 304A received at the input I1 to reduce power reflected from the plasma chamber 304 towards the LF RF generator via the impedance matching circuit 601. The impedance is modified to match an impedance of a load coupled to the output O4 with an impedance of a source coupled to the input I1 to output the modified RF signal 610A from an output of the inductor L3. The modified signal 610A is an example of the first modified RF signal, described above with reference to FIG. 3. An example of the load coupled to the output O4 includes the plasma chamber 304, the RF transmission line 302 that couples the impedance matching circuit 601 to the plasma chamber 304, and the uniformity control circuit 339. An example of the source coupled to the input I1 includes the LF RF generator and the RF cable 208A that couples the LF RF generator to the input I1.

Similarly, the branch circuit 602B modifies an impedance of the high frequency RF signal 304B received at the input I2 to reduce power reflected from the plasma chamber 304 towards the HF RF generator via the impedance matching circuit 601. The impedance is modified to match an impedance of the load coupled to the output O4 with an impedance of a source coupled to the input I2 to output the modified RF signal 610B from an output of the RF strap portion 604B. The modified RF signal 610B is an example of the second modified RF signal, described above with reference to FIG. 3. An example of the source coupled to the input I2 includes the HF RF generator and the RF cable 208B (FIG. 2) that couples the high frequency RF generator to the input I2. The modified signals 610A and 610B output from the inductor L3 and the RF strap portion 304B are combined, such as added, at the output O4, to provide the combined RF signal 312 at the output O4.

In one embodiment, any of the capacitors or inductors illustrated in FIG. 6 is fixed or variable. For example, one or more of the capacitors C4 through C7 are fixed capacitors. As another example, one or more of the inductors L1 through L4 are variable inductors and their inductances can be varied.

In an embodiment, instead of the RF strap portions 604A and 604B of the RF strap, two RF straps are used. For example, a first RF strap having an inductance of the RF strap portion 604A is connected via a connector to a second RF strap having an inductance of the RF strap portion 604B. Examples of the connector are provided above.

In an embodiment, the impedance matching circuit 601 includes a different number of capacitors than that illustrated in FIG. 6. For example, instead of the capacitors C5 and C6, one capacitor is used. In one embodiment, the impedance matching circuit 601 includes a different number of inductors than that illustrated in FIG. 6.

In one embodiment, in place of the fixed capacitor Cx of the UCC 339, the variable capacitor Cvx is used.

Figure 7:
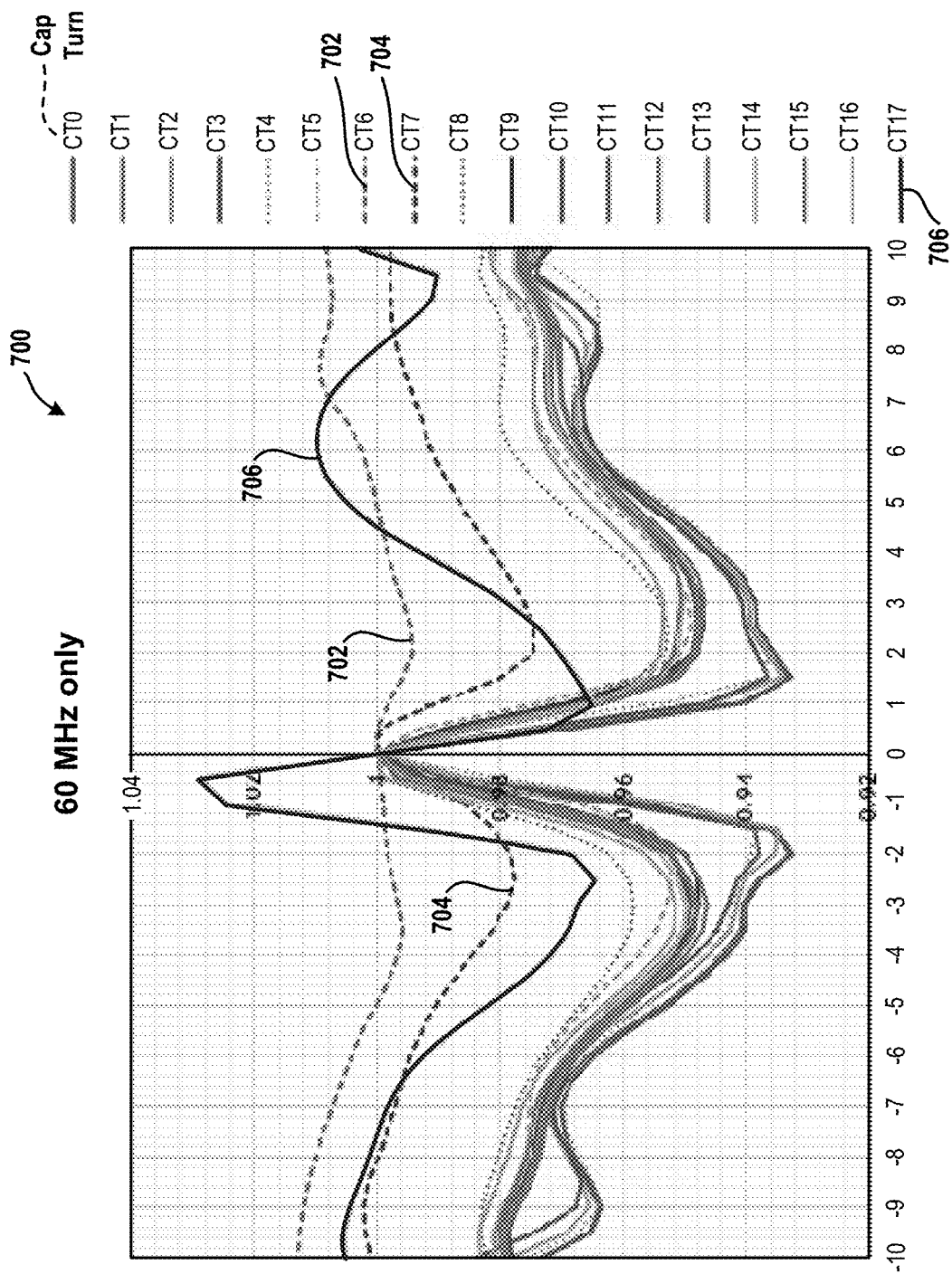
FIG. 7 is an embodiment of a graph to illustrate a change in a uniformity in an etch rate with a change in a capacitance of the variable capacitor or a change in a capacitance of a fixed capacitor.

FIG. 7 is an embodiment of a graph 700 to illustrate a change in a uniformity in an etch rate with a change in a capacitance of the variable capacitor Cvx (FIG. 5B) or a change in a capacitance of the fixed capacitor Cx (FIG. 5A). The graph 700 is generated when the HF RF generator is operational and the LF RF generator is not operational. To illustrate, the graph 700 is generated when the HF RF generator is generating RF power and the LF RF generator is not generating RF power.

The graph 700 plots the uniformity on a y-axis and plots a radius of the substrate S on an x-axis. With rotation of a first plate of a capacitor, such as the capacitor Cx or the variable capacitor Cvx, with respect to a second plate of the capacitor, there is a change in the uniformity in the etch rate across the top surface 502 of the substrate S. For example, when a number of capacitor turns, such as steps or clicks, of the capacitor Cx or Cvx is CT6, the uniformity in the etch rate is illustrated by a curve 702. Also, when a number of capacitor turns of the capacitor Cx or Cvx is CT7, the uniformity in the etch rate is illustrated by a curve 704 and when a number of capacitor turns of the capacitor Cx or Cvx is CT17, the uniformity in the etch rate is illustrated by a curve 706. As shown, the curve 702 has the highest uniformity among uniformities of the curves 702, 704, and 706. As such, by controlling a number of capacitor turns of the first plate with respect to the second plate of the capacitor, uniformity in an etch rate across the top surface 502 of the substrate S is controlled.

Figure 8:
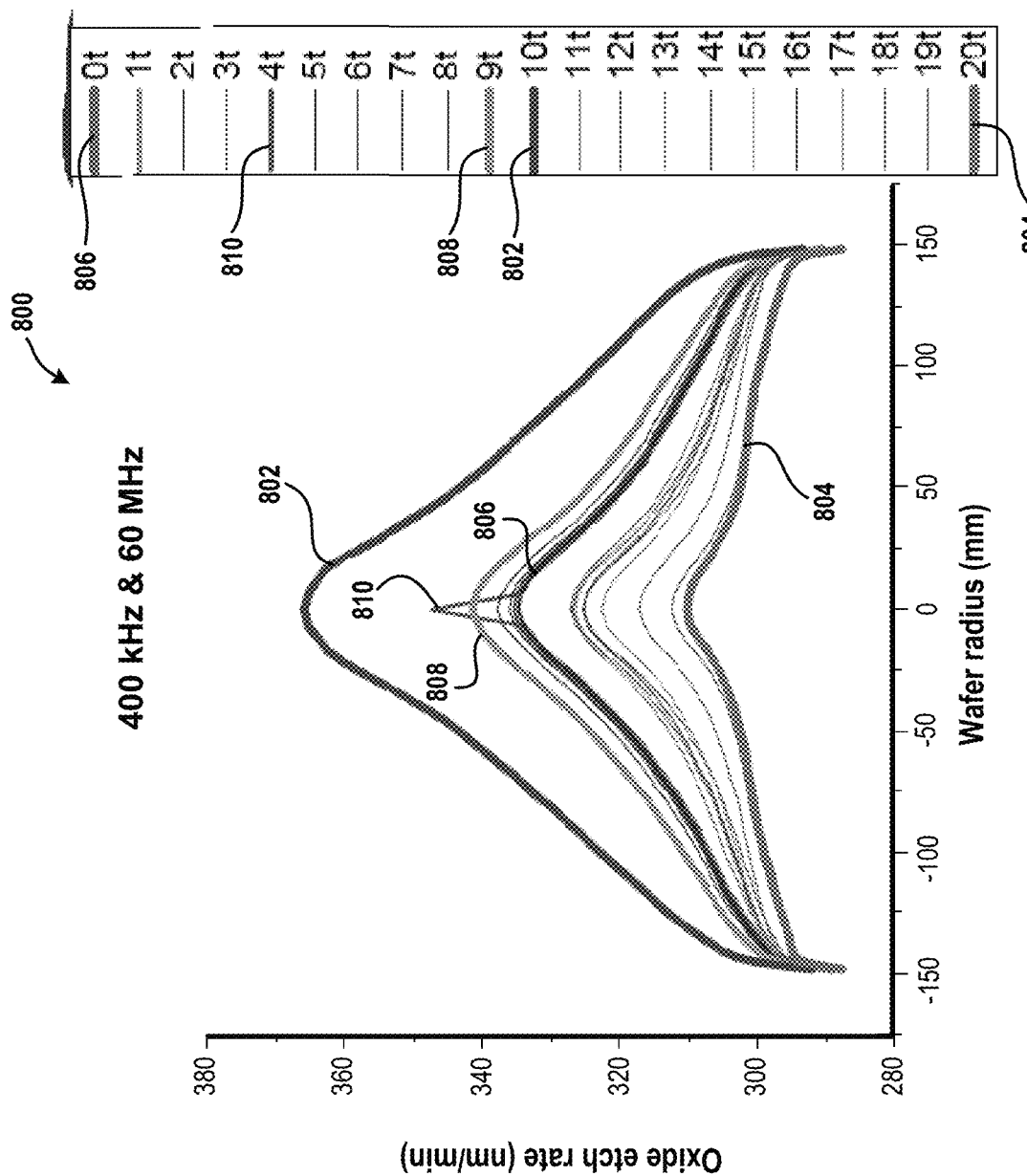
FIG. 8 is an embodiment of a graph to illustrate a change in a uniformity in an etch rate with a change in a capacitance of the variable capacitor or a change in a capacitance of the fixed capacitor.

FIG. 8 is an embodiment of a graph 800 to illustrate a change in a uniformity in an etch rate with a change in a capacitance of the variable capacitor Cvx (FIG. 5B) or a change in a capacitance of the fixed capacitor Cx (FIG. 5A). The graph 800 is generated when both the HF RF generator and the LF RF generator are operational.

The graph 800 plots the uniformity on a y-axis and plots a radius of the substrate S on an x-axis. With a change in a number of capacitor turns, such as steps or clicks, of a first plate of a capacitor, such as the capacitor Cx or the variable capacitor Cvx, with respect to a second plate of the capacitor, there is a change in the uniformity in the etch rate across the top surface 502 of the substrate S. For example, when a number of capacitor turns of the capacitor Cx or Cvx is 10, the uniformity in the etch rate is illustrated by a curve 802. Also, when a number of capacitor turns of the capacitor Cx or Cvx is 20, the uniformity in the etch rate is illustrated by a curve 804 and when a number of capacitor turns of the capacitor Cx or Cvx is zero, the uniformity in the etch rate is illustrated by a curve 806. When a number of capacitor turns of the capacitor Cx or Cvx is 9, the uniformity in the etch rate is illustrated by a curve 808. Also, when a number of capacitor turns of the capacitor Cx or Cvx is four, the uniformity in the etch rate is illustrated by a curve 810. As shown, the curve 804 has the highest uniformity among uniformities of the curves 802-810.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. An impedance match housing comprising:
an impedance matching circuit having an input configured to be coupled to a radio frequency (RF) generator and an output that is coupled to a first RF strap; and
a uniformity control circuit coupled in parallel to a portion of the first RF strap to modify uniformity in a processing rate of a substrate when the substrate is processed within a plasma chamber.

2. The impedance match housing of claim 1, wherein the first RF strap is configured to be coupled to an RF transmission line.

3. The impedance match housing of claim 1, wherein the uniformity control circuit includes a capacitor that is coupled in parallel to the portion of the first RF strap.

4. The impedance match housing of claim 1, wherein the uniformity control circuit includes a capacitor, wherein the capacitor has a first end and a second end, wherein the first end is coupled to a first point on the first RF strap and the second end is coupled to a second point on the first RF strap.

5. The impedance match housing of claim 4, wherein the uniformity control circuit includes a second RF strap and a third RF strap, wherein the first end of the capacitor is coupled via the second RF strap to the first point on the first RF strap, and the second end of the capacitor is coupled via the third RF strap to the second point on the first RF strap.

6. The impedance match housing of claim 5, wherein the first RF strap has an internal inductance, the second RF strap has an internal inductance, and the third RF strap has an internal inductance.

7. The impedance match housing of claim 5, wherein each of the first RF strap, the second RF strap, and the third RF strap is an elongated piece of metal.

8. The impedance match housing of claim 5, wherein each of the first RF strap, the second RF strap, and third RF strap is not an inductive coil.

9. The impedance match housing of claim 1, wherein the uniformity control circuit includes a variable capacitor.

10. The impedance match housing of claim 1, wherein the uniformity control circuit includes a variable capacitor that is configured to be coupled to a motor for varying a capacitance of the variable capacitor.

11. The impedance match housing of claim 10, wherein the capacitance of the variable capacitor is configured to be modified to achieve uniformity in a processing rate across a top surface of the substrate.

12. The impedance match housing of claim 10, wherein the capacitance of the variable capacitor is configured to be modified based on a measurement of uniformity in a processing rate across a top surface of the substrate.

13. The impedance match housing of claim 1, wherein the first RF strap is an elongated piece of metal and is not an RF coil.

14. A uniformity control circuit comprising:
a first radio frequency (RF) strap;
a second RF strap coupled to the first RF strap;
a capacitor coupled to the second RF strap; and
a third RF strap coupled to the capacitor and to the first RF strap, wherein the first RF strap is configured to be coupled between an output of an impedance matching circuit and an RF transmission line coupled to a plasma chamber.

15. The uniformity control circuit of claim 14, wherein the first RF strap has a first point and a second point, wherein the second RF strap has a first end and a second end, wherein the first end of the second RF strap is coupled to the first point on the first RF strap.

16. The uniformity control circuit of claim 15, wherein the capacitor has a first end and a second end, wherein the first end of the capacitor is coupled to the second end of the second RF strap.

17. The uniformity control circuit of claim 16, wherein the third RF strap has a first end and a second end, wherein the first end of the third RF strap is coupled to the second end of the capacitor, wherein the second end of the third RF strap is coupled to the second point on the first RF strap.

18. The uniformity control circuit of claim 17, wherein the capacitor is a variable capacitor having a capacitance, wherein the variable capacitor is configured to be coupled to a motor to modify the capacitance, wherein the capacitance is modified to achieve uniformity in a processing rate across a top surface of a substrate.

19. The uniformity control circuit of claim 14, wherein the capacitor is a first fixed capacitor, wherein the first fixed capacitor is configured to be replaced with a second fixed capacitor to achieve uniformity in a processing rate across a top surface of a substrate.

20. The uniformity control circuit of claim 14, wherein the capacitor is a variable capacitor having a capacitance, wherein the variable capacitor is configured to be coupled to a motor to modify the capacitance, wherein the capacitance is modified based on a measurement of uniformity in a processing rate across a top surface of a substrate.

* * * * *